United States Patent
Chen

(10) Patent No.: US 12,272,649 B2
(45) Date of Patent: *Apr. 8, 2025

(54) SEMICONDUCTOR DEVICE AND METHOD

(71) Applicant: TAIWAN SEMICONDUCTOR MANUFACTURING COMPANY, LTD., Hsinchu (TW)

(72) Inventor: Chung-Hui Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/522,980

(22) Filed: Nov. 29, 2023

(65) Prior Publication Data
US 2024/0096804 A1    Mar. 21, 2024

Related U.S. Application Data

(63) Continuation of application No. 17/225,578, filed on Apr. 8, 2021, now Pat. No. 11,842,963.
(Continued)

(51) Int. Cl.
*H01L 23/528* (2006.01)
*G06F 30/392* (2020.01)
(Continued)

(52) U.S. Cl.
CPC ........ *H01L 23/5286* (2013.01); *G06F 30/392* (2020.01); *H01L 27/092* (2013.01);
(Continued)

(58) Field of Classification Search
CPC ............... H01L 23/5286; H01L 27/092; H01L 29/0665; H01L 29/42392; H01L 29/78696;
(Continued)

(56) References Cited

U.S. PATENT DOCUMENTS 10,734,412 B2    8/2020  Glass et al.
11,842,963 B2 *  12/2023 Chen ................... H01L 23/5286
(Continued)

FOREIGN PATENT DOCUMENTS

JP    2003204259    7/2003
JP    2010-171166   8/2010
(Continued)

OTHER PUBLICATIONS

Office Action dated Dec. 24, 2021 for corresponding case No. TW 11021257110. (pp. 1-3).
(Continued)

*Primary Examiner* — Tong-Ho Kim
(74) *Attorney, Agent, or Firm* — Hauptman Ham, LLP

(57) ABSTRACT

A semiconductor device includes a first conductive line extending in a first direction on a front side of a semiconductor wafer, a first power rail extending in the first direction on a back side of the semiconductor wafer, and a first transistor including a first gate structure extending in a second direction perpendicular to the first direction, first and second active regions adjacent to the first gate structure, and a first channel region extending between the first and second active regions through the first gate structure. A first via is positioned between and electrically connects the first active region and the first conductive line, and a second via is positioned between and electrically connects the second active region and the first power rail.

20 Claims, 20 Drawing Sheets

Related U.S. Application Data

(60) Provisional application No. 63/024,926, filed on May 14, 2020.

(51) Int. Cl.
  *H01L 27/092* (2006.01)
  *H01L 29/06* (2006.01)
  *H01L 29/423* (2006.01)
  *H01L 29/786* (2006.01)

(52) U.S. Cl.
  CPC .... *H01L 29/0665* (2013.01); *H01L 29/42392* (2013.01); *H01L 29/78696* (2013.01)

(58) Field of Classification Search
  CPC ..... H01L 21/823475; H01L 21/823871; H01L 27/0629; H01L 27/088; G06F 30/392; G06F 30/394
  USPC ......................................................... 257/351
  See application file for complete search history.

(56) References Cited

U.S. PATENT DOCUMENTS

| | | |
|---|---|---|
| 2003/0207523 A1 | 11/2003 | Liu et al. |
| 2010/0181547 A1 | 7/2010 | Kuroda |
| 2013/0011965 A1 | 1/2013 | White et al. |
| 2019/0164882 A1 | 5/2019 | Chen et al. |
| 2020/0135646 A1 | 4/2020 | Rubin et al. |
| 2020/0373301 A1* | 11/2020 | Kim ................... H01L 29/0847 |
| 2021/0028112 A1* | 1/2021 | Kim ................. H01L 29/41791 |

FOREIGN PATENT DOCUMENTS

| | | |
|---|---|---|
| KR | 20190015269 | 2/2019 |
| TW | I649837 | 2/2019 |
| TW | I671881 | 9/2019 |

OTHER PUBLICATIONS

Office Action dated Apr. 26, 2022 for corresponding case No. DE 10 2021 109 463.1 (p. 1).

* cited by examiner

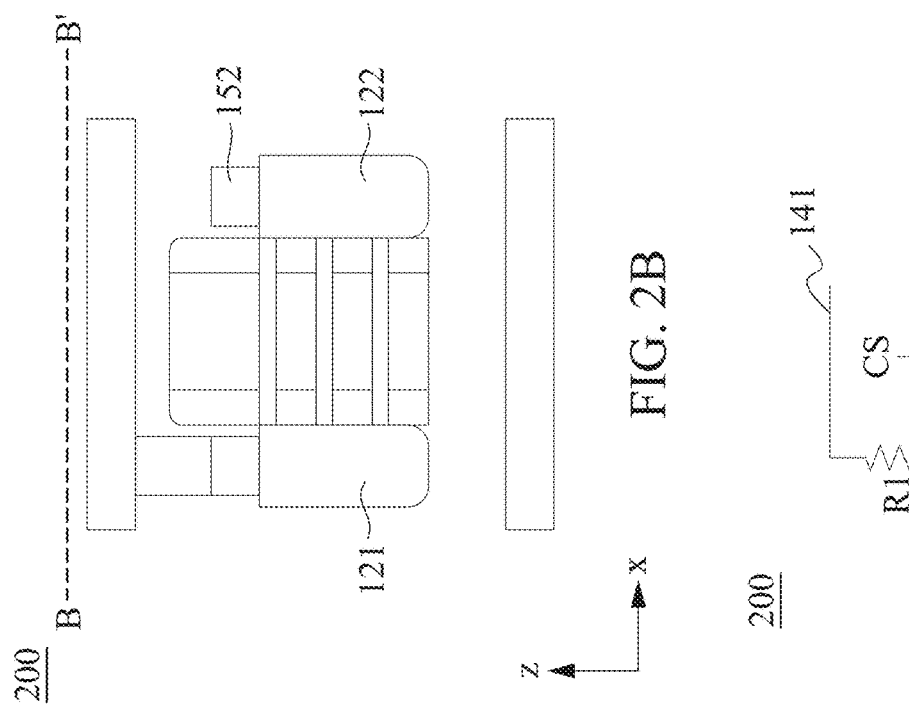
FIG. 2B
FIG. 2C
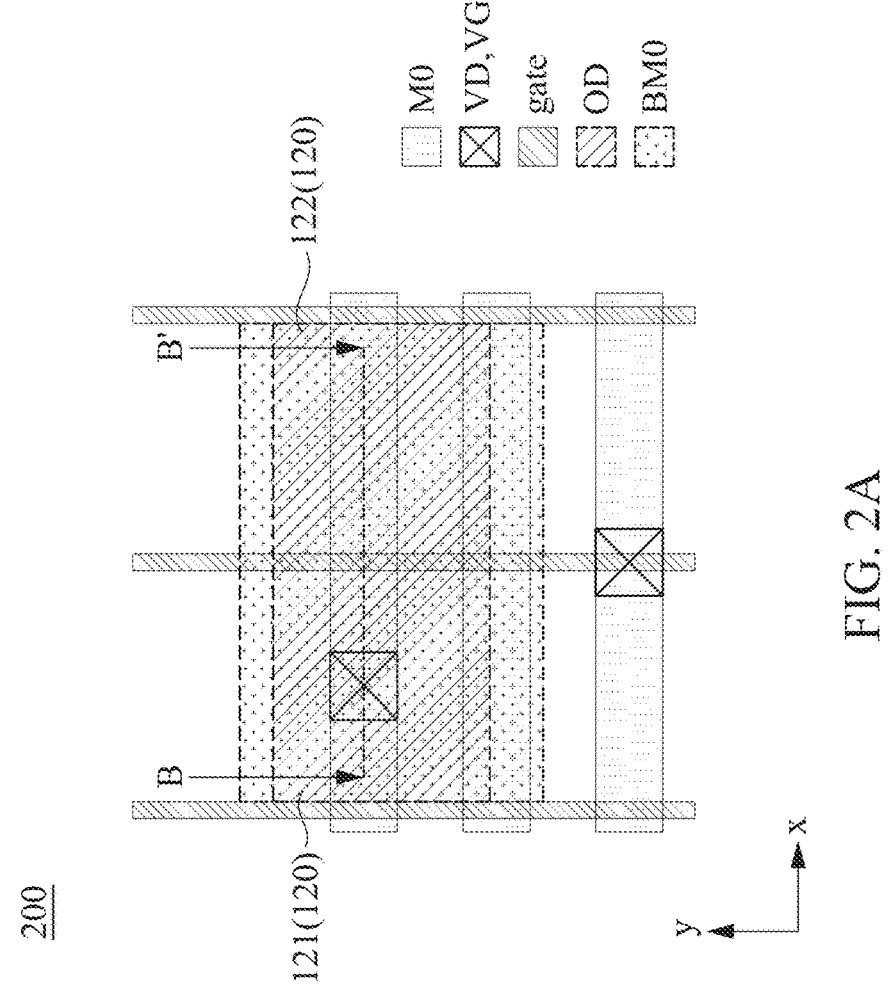
FIG. 2A

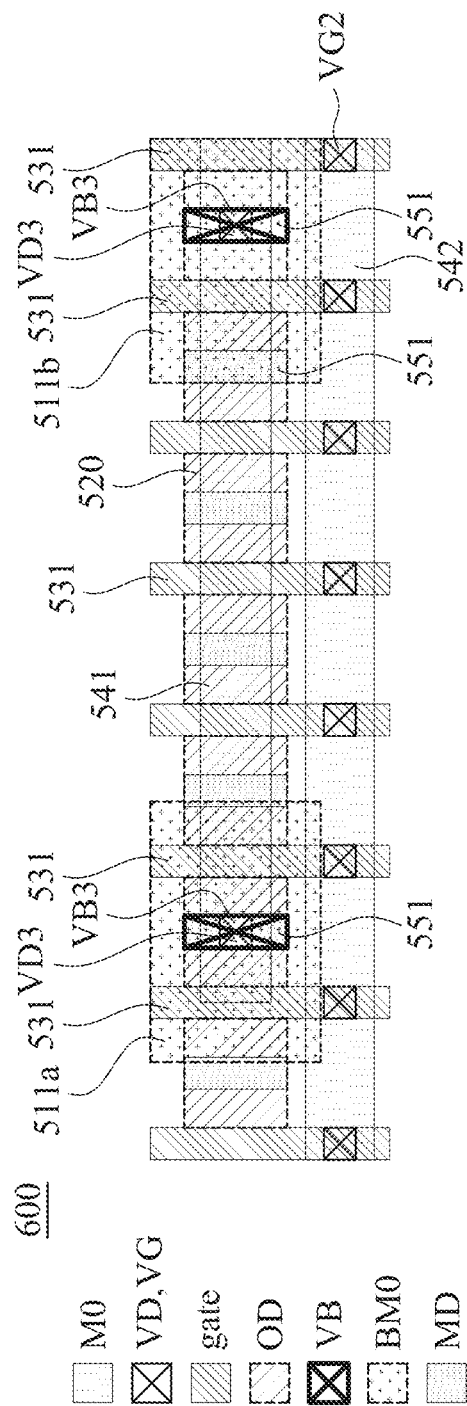
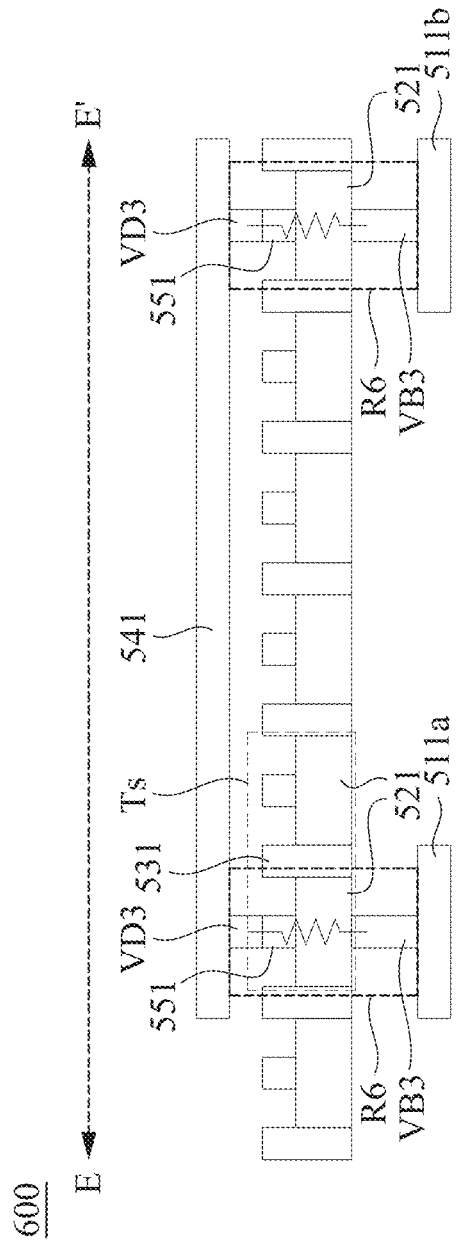
FIG. 6A
FIG. 6B

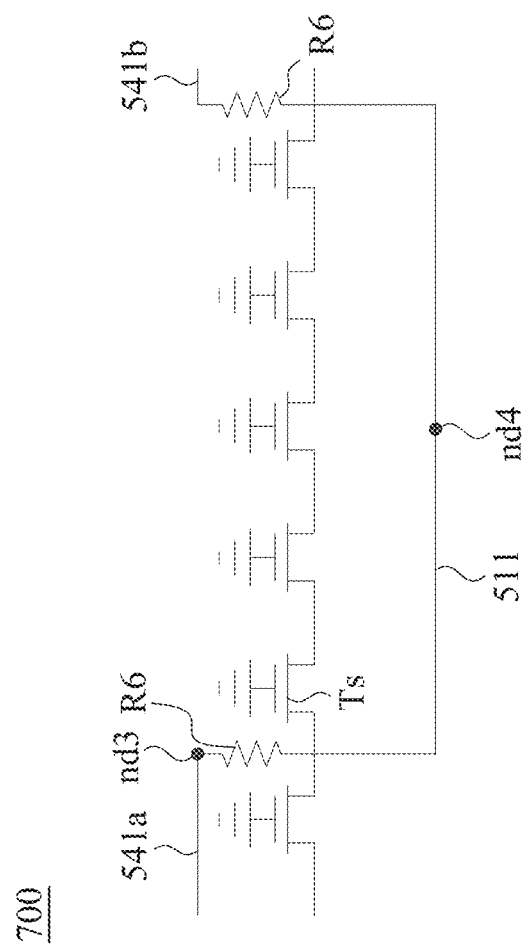

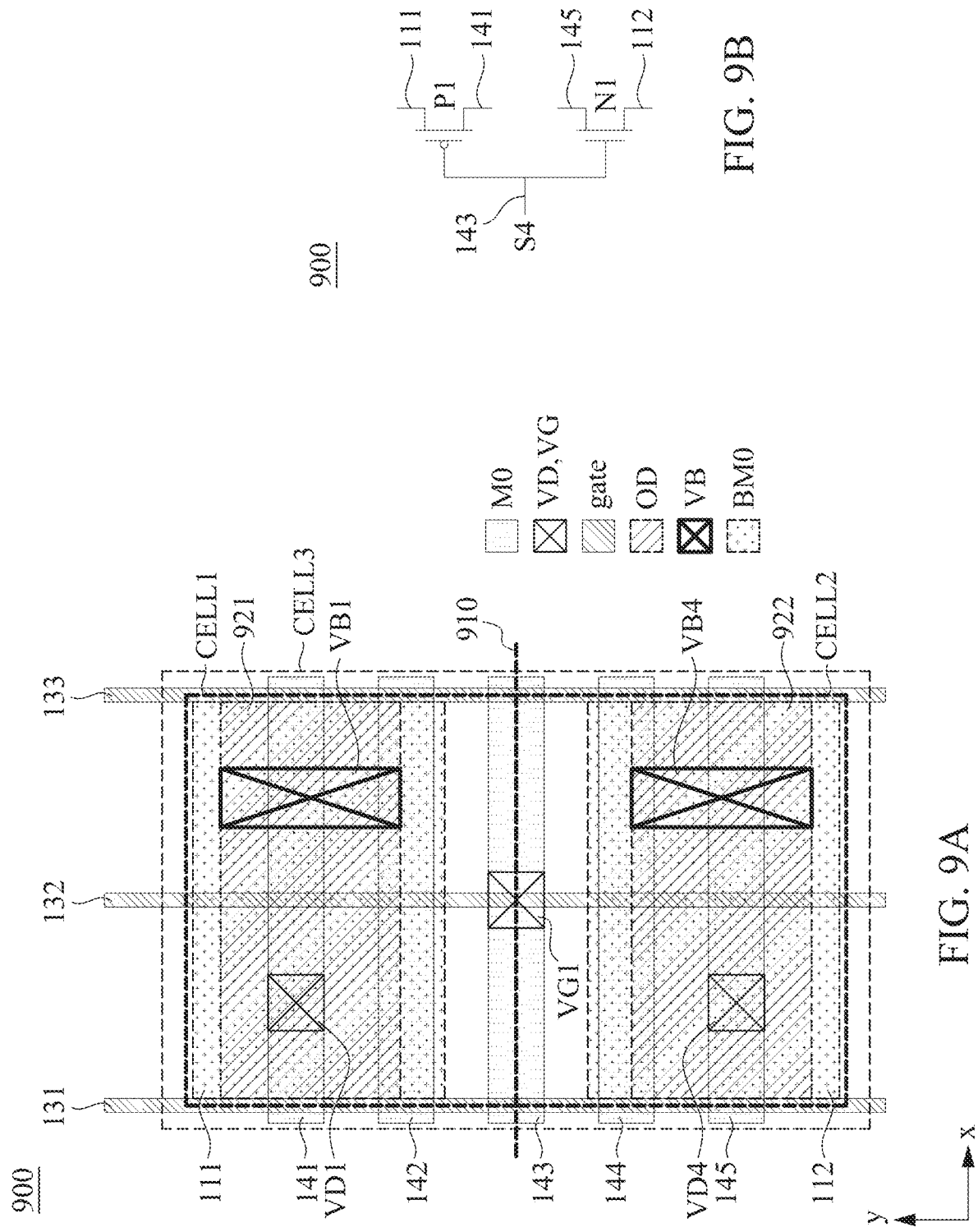

1300A

```
IDENTIFYING A CONNECTION CONFIGURATION
BETWEEN A FIRST NODE AND A SECOND NODE IN      ~1310
           AN INTEGRATED CIRCUIT
```

```
IN RESPONSE TO THE CONNECTION CONFIGURATION
    INDICATING THAT THE FIRST NODE RECEIVES A
 SUPPLY VOLTAGE TRANSMITTED FROM THE SECOND      ~1320
  NODE, GENERATING A LAYOUT DESIGN OF THE
              INTEGRATED CIRCUIT
```

```
    GENERATING A FIRST CONDUCTIVE LINE
EXTENDING ALONG A FIRST DIRECTION IN A FIRST
  LAYER AT A FRONT SIDE OF THE INTEGRATED      ~1321
    CIRCUIT TO BE COUPLED TO THE FIRST NODE
```

```
 GENERATING A POWER RAIL EXTENDING ALONG
     THE FIRST DIRECTION IN A SECOND LAYER,
BELOW THE FIRST LAYER, AT A BACK SIDE OF THE   ~1322
      INTEGRATED CIRCUIT TO BE COUPLED TO THE
                    SECOND NODE
```

```
       GENERATING AN ACTIVE AREA EXTENDING
  ALONG THE FIRST DIRECTION IN A THIRD LAYER,
   BETWEEN THE FIRST LAYER AND THE SECOND      ~1323
                        LAYER
```

```
GENERATING A FIRST VIA COUPLED BETWEEN A
    FIRST REGION OF THE ACTIVE AREA AND THE
  FIRST CONDUCTIVE LINE, AND GENERATING A
   SECOND VIA COUPLED BETWEEN A SECOND         ~1324
REGION OF THE ACTIVE AREA AND THE FIRST
                 CONDUCTIVE LINE
```

```
  GENERATING A THIRD VIA COUPLED BETWEEN
THE FIRST REGION OF THE ACTIVE AREA AND THE
  POWER RAIL, AND GENERATING A FOURTH VIA      ~1325
COUPLED BETWEEN THE SECOND REGION OF THE
           ACTIVE AREA AND THE POWER RAIL
```

FIG. 13A

SEMICONDUCTOR DEVICE AND METHOD

PRIORITY CLAIM

The present application is a continuation of and claims the priority of U.S. application Ser. No. 17/225,578, filed Apr. 8, 2021, now U.S. Pat. No. 11,842,963, issued Dec. 12, 2023, which claims the priority of U.S. Provisional Application No. 63/024,926, filed May 14, 2020, each of which is incorporated herein by reference in its entirety.

BACKGROUND

Integrated circuits have been widely used for various kinds of applications. The demand for faster processing speed, lower power consumption, and smaller size is increasing. Various cells including digital cells and analog cells are designed for manufacturing the integrated circuits. For the analog cells, the resistance of metal routing coupled between active devices in the integrated circuits and the power rail is significant due to small geometry size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a layout diagram in a plan view of a semiconductor device, in accordance with various embodiments.

FIG. 2B is a cross-sectional view of part of the semiconductor device in FIG. 2A along a line BB', in accordance with various embodiments.

FIG. 2C is an equivalent circuit corresponding to part of the semiconductor device of FIGS. 2A-2B, in accordance with various embodiments.

FIG. 6A is a layout diagram in a plan view of a semiconductor device, in accordance with various embodiments.

FIG. 6B is a cross-sectional view of part of the semiconductor device in FIG. 6A along a line EE', in accordance with various embodiments.

FIG. 7C is an equivalent circuit corresponding to part of the semiconductor device of FIGS. 7A-7B, in accordance with various embodiments.

FIG. 9A is a layout diagram in a plan view of a semiconductor device, in accordance with various embodiments.

FIG. 9B is an equivalent circuit corresponding to part of the semiconductor device of FIG. 9A, in accordance with various embodiments.

FIG. 13A is a flow chart of a method of forming an integrated circuit, in accordance with some embodiments of the present disclosure.

DETAILED DESCRIPTION

Figure 1B:
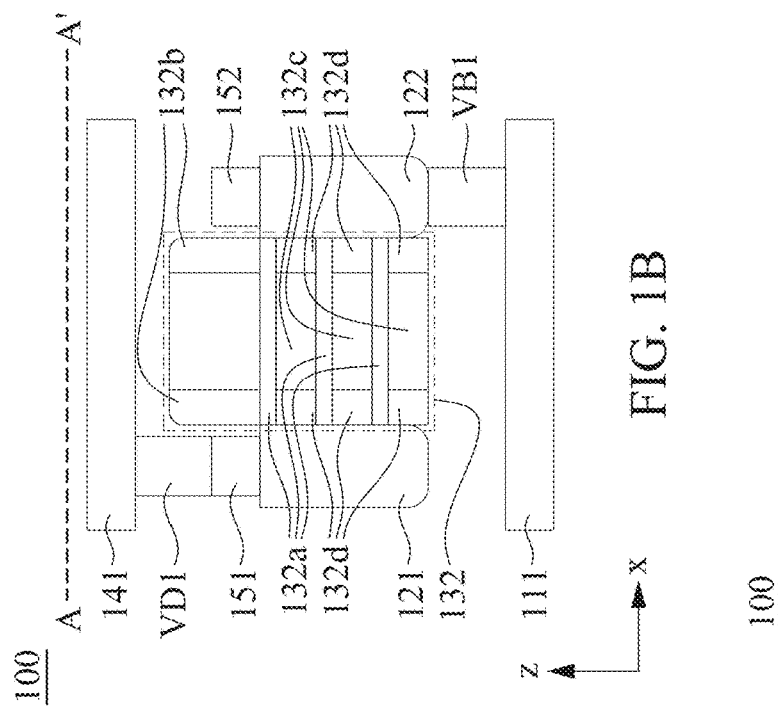
FIG. 1B is a cross-sectional view of part of the semiconductor device in FIG. 1A along a line AA', in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

In some layout designs of analog circuits, pick-up regions are positioned in a cell to conductively connect a particular dopant type well in the cell to a voltage source. More specifically, in various embodiments, an n-type pick-up region is used to conductively connect an n-type well in the cell to the first supply voltage VDD, and/or a p-type pick-up region is used to conductively connect a p-type well in the cell to the second supply voltage VSS. Embodiments described below provide analog cells including transistor structures to couple front-side metal layers to back-side power rails in order to reduce the cell area and parasitic resistance and capacitance that are contributed by the metal routing. In some embodiments, at least one of the transistor structure, constructed with vias coupling doped regions of the transistor to both of metal layers in front and back side, is referred to as a via pillar to connect back-side power components, such as bumps, super high-density metal-insulator-metal (SHD-MIM), and inductors to front-side components, such as metal-oxide-metal (MOM) capacitor, gates of MOSFET, and high-resistance elements. It significantly cuts the parasitic resistance of metal routing between the front-side and back-side metal layers. Moreover, tied-off grounded gates of the aforementioned transistor structure includes de-capacitor for area saving; whereas as the gates of the transistor structure are floating to obtain lowest parasitic capacitance for high operation speed. In another embodiment, differential pair switches of a current mirror circuit include another transistor structure having a first doped region coupled to the front side metal and a second doped region coupled to the back side power rail, while the other transistor structure functions as a current mirror switch in the current mirror circuit. In still another embodiment, standard cells, such as a cell including an inverter, consist of a combination of the analog cells which overlap at least two and half front-side metal tracks and different numbers of, for example, P-type MOS or N-type MOS. With the configurations of the present disclosure, operation speed of analog surges and the cell area shrinks, comparing to some approaches of back side power rail configuration.

FIGS. 1A-3C depict semiconductor devices 100-300, each of which is a component of one or more of IC 400 or semiconductor devices 500, 600, 700, 900, 1000, 1100, or 1200 discussed below with respect to FIGS. 4-12B.

Figure 1C:
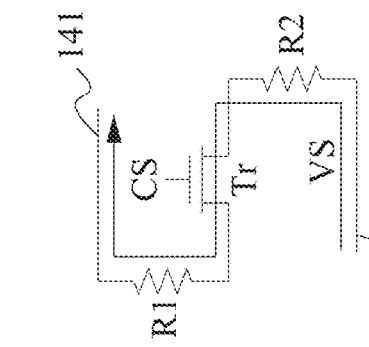
FIG. 1C is an equivalent circuit corresponding to part of the semiconductor device of FIGS. 1A-1B, in accordance with various embodiments.
Figure 1A:
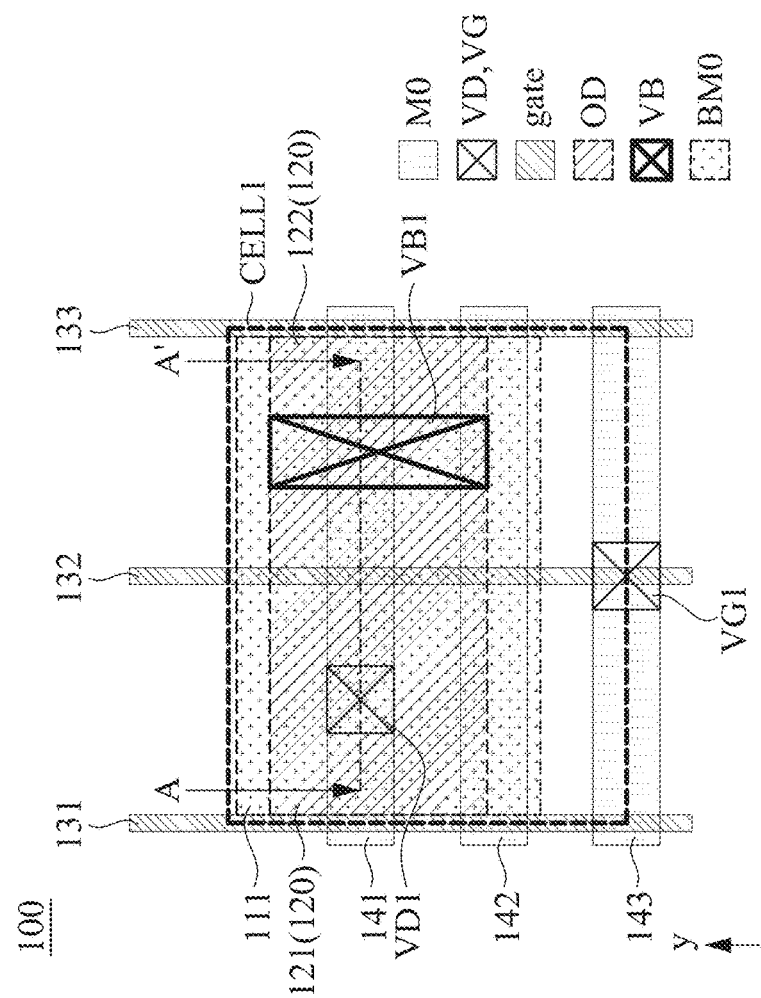
FIG. 1A is a layout diagram in a plan view of a semiconductor device, in accordance with various embodiments.

Reference is now made to FIG. 1A. FIG. 1A is a layout diagram in a plan view of the semiconductor device 100, in accordance with various embodiments. In some embodiments, the semiconductor device 100 is implemented in, for example, an analog circuit that includes at least one output signal having an analog value that is a continuous function of an analog value of an input signal of the analog circuit. As illustratively shown in FIG. 1A, the semiconductor device 100 includes a power rail (i.e., Back-side metal zero layer, BMO) 111, active regions (i.e., oxide-diffusion, OD) 121-122, gate structures 131-133, conductive line (i.e., metal zero layer, MO) 141-143, and vias VB1, VD1, and VG1. In some embodiments, the power rail 111 is arranged in a first layer. The active regions 121-122 and the gate structures 131-133 are arranged in a second layer above the first layer. The conductive lines 141-143 are arranged in a third layer above the second layer. The via VB1 is arranged between the first layer and the second layer. The vias VD1 and VG1 are arranged between the second layer and the third layer.

For illustration, the power rail 111 extends in x direction. The gate structures 131-133 extend in y direction and cross the power rail 111 in a layout view. The gate structures 131-133 are separated from each other in x direction. The gate structure 132 is interposed between the active regions 121-122. The conductive lines 141-143 extend in x direction and are separated from each other in y direction. In the layout view, at least one of the conductive lines 141-143 overlaps the power rail 111. In other words, the power rail 111 and the conductive line 141 are on the opposite sides of the active regions 121-122, and the gate structure 132.

In some embodiments, as shown in FIG. 1A, a width of the via VB1 along y direction is substantially the same with a width of the active region 122. In various embodiments, the width of the via VB1 along y direction is between the width of the active region 122 and a width of the power rail 111. In various embodiments, the via VB1 has a tapered shape.

In some embodiments, the power rail 111, the active regions 121-122, the gate structures 131-133, the vias VD1 and VB1, the conductive lines 141-142, and half of the conductive line 143 are included in an analog cell CELL1. In some embodiments, the conductive lines 141-143 are arranged in three metal tracks in the semiconductor device 100. The configurations of the analog cell CELL1 are given for illustrative purposes. Various implementations are within the contemplated scope of the present disclosure. For example, in some embodiments, the analog cell CELL1 includes conductive line(s) arranged in 1, 1.5, 2, 2.5, 3 . . . or 100 metal tracks.

In some embodiments, the power rail 111 includes copper (Cu), aluminum (Al), ruthenium (Ru), cobalt (Co), molybdenum (Mo), nickel (Ni), tungsten (W), or the like. In various embodiments, the power rail 111 acts as a power rail (e.g., VDD or VSS) at the backside of the semiconductor device 100, and thus the power rail 111 is interchangeably referred to as a backside power line or a backside power rail.

In some embodiments, the conductive lines 141-143 include copper (Cu), aluminum (Al), ruthenium (Ru), cobalt (Co), molybdenum (Mo), nickel (Ni), tungsten (W), or the like.

In some embodiments, the conductive lines 141-143 are included in a first conductive layer of a plurality of conductive layers. In some embodiments, the plurality of conductive layers includes one or more layers in which a material, referred to as a Hi R material in some embodiments, has a resistivity greater than or equal to about 5 micro-ohm-centimeters. In some embodiments, a Hi R material is included in a metal plate as part of a capacitive device. In some embodiments, one or more conductive layers of the plurality of conductive layers include W, TiN, TaN, Co, Mo, Mn, Ru, Ta, TiW, Ta—Si—N, TiZrN, CoTix, AlC, TiGeN, Cr, CrAsC, TiAlC, WNx, or another suitable material.

In some embodiments, the vias VD1, via VB1, and VG1 include a conductive material, such as tungsten (W). Other conductive materials may be used for the vias VD1, via VB1, and VG1, such as copper (Cu), aluminum (Al), ruthenium (Ru), cobalt (Co), molybdenum (Mo), nickel (Ni), or the like.

In some embodiments, the active regions 121-122 include n-type dopants, including, such as phosphorus, arsenic, or a combination thereof or p-type dopants including, such as boron, indium, aluminum, gallium, or a combination thereof.

In some embodiments, the gate structures 131-133 includes channel regions 132*a*, spacer layers 132*b*, metal gate layers 132*c*, and inner spacer material layers 132*d*, as the gate structure 132 shown in FIG. 1B. FIG. 1B is a cross-sectional view of part of the semiconductor device 100 in FIG. 1A along a line AA', in accordance with various embodiments.

The channel regions 132*a* include nanosheet channels extending in x direction and separated in y direction. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. In various embodiments, the channel region 132*a* includes materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof.

The spacer layers 132*b* are above the channel regions 132*a*. In some embodiments, the spacer layer 132*b* is disposed conformally on top and configured as sidewalls of the gate structure 132. The spacer layer 132*b* includes a dielectric material such as silicon oxide, silicon nitride, silicon carbide, silicon oxynitride, SiCN films, silicon oxycarbide, SiOCN films, and/or combinations thereof.

The metal gate layers 132*c* are disposed between spacer layers 132*b* and surrounded by the channel regions 132*a*. In some embodiments, the metal gate layer 132*c* includes a p-type work function metal or an n-type work function metal, and is deposited by CVD, PVD, and/or other suitable process. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers use aluminum (Al), tungsten (W), copper (Cu), cobalt (Co), and/or other suitable materials; and are formed by CVD, PVD, plating, and/or other suitable processes.

The inner spacer material layers 132*d* are formed to isolate metal gate layers 132*c* from active regions 121-122. In some embodiments, the inner spacer material layer 132*d* is a low-K dielectric material, such as SiO$_2$, SiN, SiCN, or SiOCN, and may be formed by a suitable deposition method, such as ALD. In various embodiments, sidewalls of the inner spacer material layers 132*d* are aligned with sidewalls of the channel regions 132*a*.

In some embodiments, each of the gate structures 131-133 further includes interfacial layers (not shown) wrapping around each of the channel regions 132*a*, and gate dielectric layers (not shown) covers the interfacial layer. In various embodiments, the interfacial layer includes a dielectric material including, for example, silicon oxide (SiO$_2$) or silicon oxynitride (SiON), and is able to be formed by chemical oxidation, thermal oxidation, atomic layer deposition (ALD), chemical vapor deposition (CVD), and/or other suitable methods. In some embodiments, the gate dielectric layer uses a high-k dielectric material including, for example, hafnium oxide (HfO$_2$), Al$_2$O$_3$, lanthanide oxides, TiO$_2$, HfZrO, Ta$_2$O$_3$, HfSiO$_4$, ZrO$_2$, ZrSiO$_2$, combinations thereof, or other suitable material, and the gate dielectric layer is formed by ALD and/or other suitable methods. The metal gate layer includes a p-type work function metal or an n-type work function metal, and is deposited by CVD, PVD, and/or other suitable process. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers use aluminum (Al), tungsten (W), copper (Cu), cobalt (Co), and/or other suitable materials; and are formed by CVD, PVD, plating, and/or other suitable processes.

The formations and/or materials associated with the gate structures 131-133 are given for illustrative purposes. Various formations and/or materials associated with the gate structures 131-133 are within the contemplated scope of the present disclosure.

With continuing reference to FIG. 1B, the semiconductor device 100 further includes conductive segments (i.e., metal on oxide-definition areas ("MOOD" or "MD")) 151-152. In some embodiments, the conductive segments 151-152 are patterns formed over the active region patterns to define electrical connections from active devices formed by the active regions to outside circuitry.

As shown in FIG. 1B, the conductive segments 151-152 are disposed on the active regions 121-122, respectively. The via VD1 is coupled between the conductive line 141 and the conductive segment 151, and accordingly, the active region 121 is coupled to the conductive line 141 through the via VD1 and the conductive segment 151. The via VB1 is coupled between the power rail 111 and active region 122.

With reference to FIG. 1C, FIG. 1C is an equivalent circuit corresponding to part of the semiconductor device 100 of FIGS. 1A-1B, in accordance with various embodiments. In some embodiments, the active regions 121-122, and the gate structure 132 are included in a structure operating as a transistor Tr in FIG. 1C. The conductive segment 151 corresponds to a first terminal (i.e., source or drain terminal) of the transistor Tr, and the conductive segment 152 corresponds to a second terminal (i.e., drain or source terminal) of transistor Tr. The gate structure 132 corresponds to a control terminal of the transistor Tr.

In some embodiments, a resistance unit R1 represents a resistance contributed by part of the routing arranged to couple the first terminal of the transistor Tr to the conductive line 141. The aforementioned part of routing includes, for example, the via VD1 and the conductive segment 151. Similarly, the resistance unit R2 represents a resistance contributed by another part of the routing arranged to couple the second terminal of the transistor Tr to the power rail 111. The aforementioned another part of routing includes, for example, the via VB1. The details of the configuration of the resistance units R1 and R2 will be discussed in the following paragraphs.

Based on discussions above, in operations, for example, a control signal CS is received by the gate structure 132 through the conductive line 143 and the via VG1. Accordingly, the transistor Tr is configured to transmit, in response to the control signal CS, a signal VS from the power rail 111 to the conductive line 141 through the via VB1, the conductive segment 151, and via VD1. In some embodiments, the aforementioned signal VS is a voltage signal having a supply voltage level for operating a device coupled with the transistor Tr. In various embodiments, the aforementioned signal VS is a data signal transmitted from another element in the semiconductor device 100. The configurations of the operations of the semiconductor device 100 are given for illustrative purposes. Various implementations are within the contemplated scope of the present disclosure. For example, in some embodiments, the signal VS received from other elements in the semiconductor device 100 is transmitted from the conductive line 141 to the power rail 111.

In some approaches, additional pick-up regions are integrated in a semiconductor device to connect a particular dopant type well or the substrate (e.g., a bulk of an active device such as a transistor) of an active device to a voltage source. In such approaches, the pick-up regions are arranged abutting with the active device in the layout view. In contrast, with the configurations of the present disclosure, the active device is connected to the voltage source from the power rail 111 in the layer below the active device. Accordingly, the cell area is reduced and a total cell height is smaller than in such approaches.

Furthermore, in various approaches, supply voltages are transmitted in power metal layers (e.g., a metal ten layer disposed ten layers above the metal zero layer) above the active device. In such arrangements, voltage signals experience a parasitic resistance induced by the routing of layers. With configurations of the present disclosure, the power rail 111 is disposed at the back side of the active device and closer to the active device, compared with the approaches. Alternatively stated, the routing has been shortened, and the resistance represented by the resistance unit R2 is reduced correspondingly. Furthermore, the parasitic capacitances between layers experienced by the metal layers decrease as well. Accordingly, the performance (i.e., the speed) of the semiconductor device 100 is improved.

The configurations of FIGS. 1A-1C are given for illustrative purposes. Various implementations are within the contemplated scope of the present disclosure. For example, in some embodiments, the via VG1 is coupled between the conductive line 142 and the gate structure 132.

Reference is now made to FIGS. 2A-2C. FIG. 2A is a layout diagram in a plan view of the semiconductor device 200, FIG. 2B is a cross-sectional view of part of the semiconductor device 200 in FIG. 2A along a line BB', and FIG. 2C is an equivalent circuit corresponding to part of the semiconductor device 200 of FIGS. 2A-2B, in accordance with various embodiments. With respect to the embodiments of FIGS. 1A-1C, like elements in FIGS. 2A-2C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 2A-2C.

Compared with FIG. 1A, instead of having the via VB1, the semiconductor device 200 does not include the via VB1, as shown in FIGS. 2A-2B. In some embodiments, the semiconductor device 200 receives signals transmitted from other semiconductor devices, for example, the semiconductor device 100 through the conductive line 141. In various embodiments, the active region 122 of the semiconductor device 200 is coupled to other elements (i.e., other active regions or conductive lines) through the conductive segment 152. As shown in FIG. 2C, due to the absence of the via VB1, there is no equivalent resistance depicted between the transistor Tr and the power rail 111.

Figure 3B:
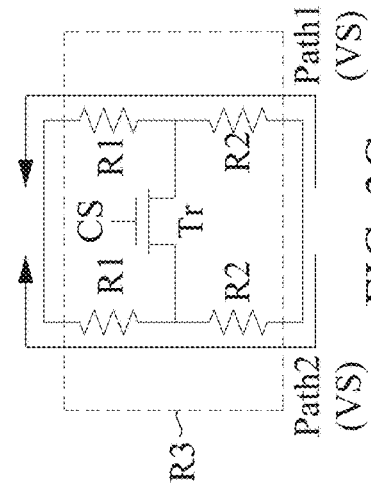
FIG. 3B is a cross-sectional view of part of the semiconductor device in FIG. 3A along a line CC', in accordance with various embodiments.
Figure 3C:
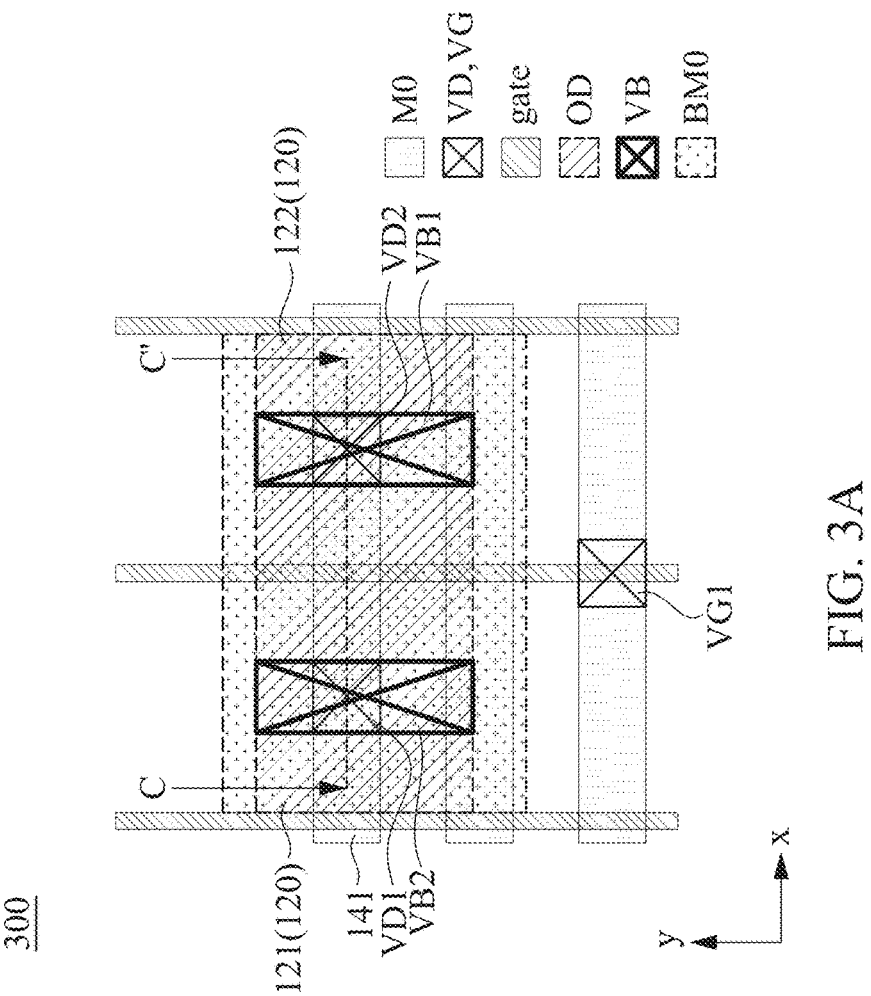
FIG. 3C is an equivalent circuit corresponding to part of the semiconductor device of FIGS. 3A-3B, in accordance with various embodiments.
Figure 3A:
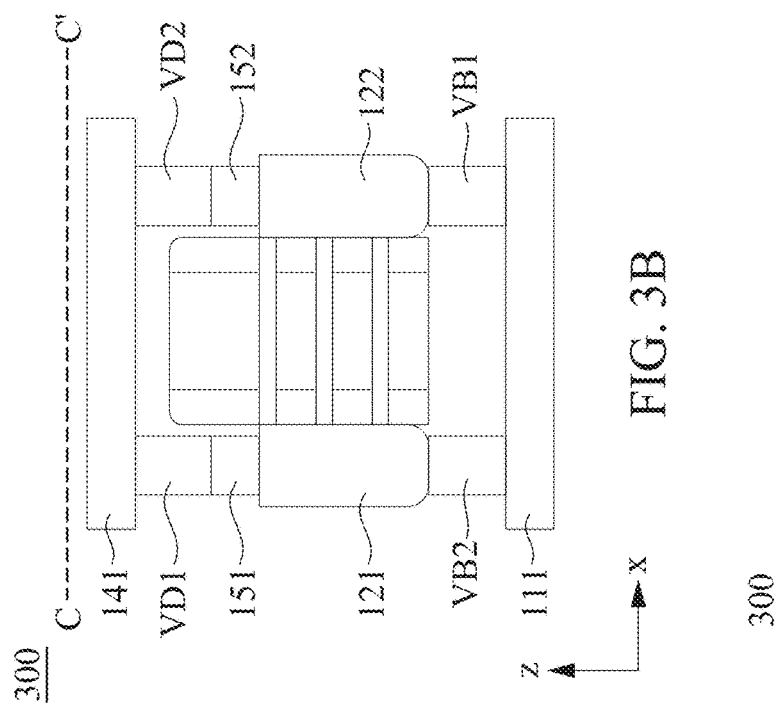
FIG. 3A is a layout diagram in a plan view of a semiconductor device, in accordance with various embodiments.

Reference is now made to FIGS. 3A-3C. FIG. 3A is a layout diagram in a plan view of the semiconductor device 300, FIG. 3B is a cross-sectional view of part of the semiconductor device 300 in FIG. 3A along a line CC', and FIG. 3C is an equivalent circuit corresponding to part of the semiconductor device 300 of FIGS. 3A-3B, in accordance with various embodiments. With respect to the embodiments of FIGS. 1A-2C, like elements in FIGS. 3A-3C are designated with the same reference numbers for ease of understanding.

Compared with FIG. 1A, the semiconductor device 300 further includes vias VD2 and VB2. In some embodiments, the vias VD2 and VB2 are configured with respect to, for example, the vias VD1 and VB2, respectively. As shown in FIG. 3A, the vias VD1 and VB2 overlap with each other. The vias VD2 and VB1 overlap with each other. For illustration, the vias VB1-VB2 have the same width in y direction.

Compared with FIG. 1B, the via VB2 is coupled between the active region 121 and the power rail 111, and accordingly, the active region 121 is further coupled to the power rail 111. In some embodiments, a resistance contributed by the routing of the via VB2 represents as another resistance unit R2 in FIG. 3C. The via VD2 is coupled between the conductive segment 152 and the conductive line 141, and accordingly, the active region 122 is further coupled to the conductive line 141. In some embodiments, a resistance contributed by the routing of the via VD2 represents as another resistance unit R1 in FIG. 3C.

Based on discussions above, in operations, independent of the transistor Tr being turned off in response to the control signal CS, the signal VS is transmitted from the power rail 111 to the conductive line 141 through a first path Path1 including the via VB1, the conductive segment 152, and via VD2 and a second path Path2 including the via VB2, the conductive segment 151, and via VD1, as shown in FIG. 3B. Alternatively stated, a total resistance of a resistance unit R3 between the conductive line 141 and power rail 111, represented by the resistance units R1 and R2 in FIG. 3C, is reduced due to two transmission paths.

The configurations of FIGS. 2A-3C are given for illustrative purposes. Various implementations are within the contemplated scope of the present disclosure. For example, in some embodiments, the resistances of the vias VB1-VB2 and/or VD1-VD2 are different from each other.

Figure 4:
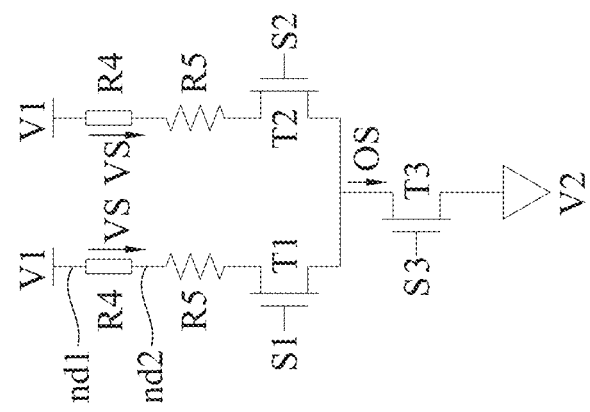
FIG. 4 is a schematic diagram of an integrated circuit, in accordance with various embodiments.

Reference is now made to FIG. 4. FIG. 4 is a schematic diagram of the integrated circuit 400, in accordance with various embodiments. In some embodiments, the integrated circuit 400 includes, for example, at least one of the semiconductor devices 100-300. For illustration, the integrated circuit 400 includes differential pair switches T1-T2, a current mirror unit T3, and resistance units R4-R5. Each of the differential pair switches T1-T2 has a first terminal coupled to one of resistance units R5 and a second terminal coupled to the current mirror unit T3. Resistance units R4 are coupled between a voltage terminal V1 (i.e., the voltage terminal V1 is referred to as a terminal supporting a voltage V1) and the resistance units R5. The current mirror unit T3 is coupled between a voltage terminal V2 (i.e., the voltage terminal V2 is referred to as a terminal supporting a voltage V2) and the differential pair switches T1-T2. In some embodiments, the voltages V1-V2 are different from each other. In various embodiments, the voltage V1 is greater than the voltage V2 (e.g., a ground.)

In some embodiments, the resistance unit R4 includes a structure implemented by the semiconductor device 300. For example, the resistance unit R4 is implemented by the resistance unit R3 in FIG. 3C. Accordingly, the resistance units R4 receive the voltage V1 from the power rail 111 and transfer the corresponding signals VS to the differential pair switches T1-T2 through the conductive line 141, as shown in FIG. 3B. In various embodiments, the resistance unit R5 corresponds to metal routing between one of the resistance unit R4 and one of the differential pair switches T1-T2.

The differential pair switches T1-T2 are configured to receive the signals VS from the resistance units R5 in response to control signals S1-S2 respectively. In some embodiments, the differential pair switches T1-T2 include structures implemented by the semiconductor device 200. For example, the differential pair switches T1-T2 are implemented by the transistor Tr in FIG. 2C. Accordingly, the differential pair switches T1-T2 receive the signals VS, in response to the control signals S1-S2 received at the gate structures 132 thereof, from the conductive line 141 coupled to the resistance units R5. In some embodiments, the differential pair switches T1-T2 are configured to output a corresponding output signal OS at the conductive segment 152 thereof, as shown in FIG. 2B. The output signal OS is further transmitted to the current mirror unit T3.

The current mirror unit T3 is configured to receive the output signal OS from the differential pair switches T1-T2 in response to a control signal S3. In some embodiments, the current mirror unit T3 includes a structure implemented by the semiconductor device 100. For example, the current mirror unit T3 is implemented as the transistor Tr in FIG. 1C. Accordingly, the current mirror unit T3 receives, in response to the control signal S3 received at the gate structure 132 thereof, the signal OS from the differential pair switches T1-T2 through the conductive line 141 coupled thereto, and transmits a corresponding signal to the voltage terminal V2.

The configurations of FIG. 4 are given for illustrative purposes. Various implementations are within the contemplated scope of the present disclosure. For example, in some embodiments, the current mirror unit T3 is configured to operate as a current source.

Figures 5A, 5B:
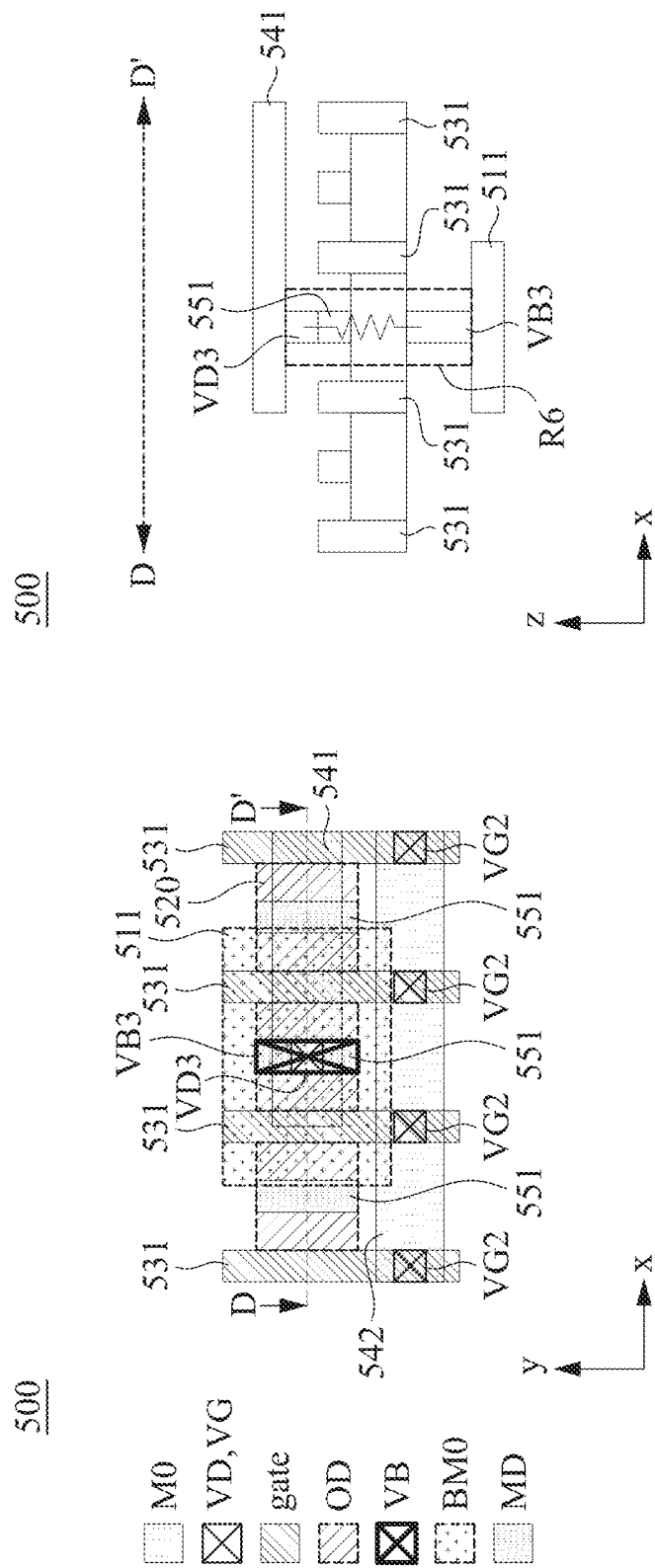
FIG. 5A is a layout diagram in a plan view of a semiconductor device, in accordance with various embodiments.
FIG. 5B is a cross-sectional view of part of the semiconductor device in FIG. 5A along a line DD', in accordance with various embodiments.

Reference is now made to FIG. 5A. FIG. 5A is a layout diagram in a plan view of the semiconductor device 500, in accordance with various embodiments. For illustration, the semiconductor device 500 includes a power rail 511, an active area 520, gate strips 531, conductive lines 541-542, conductive segments 551, vias VD3, VB3, and VG2. In some embodiments, the power rail 511 is configured with respect to, for example, the power rail 111. The active area 520 includes multiple active regions which are configured with respect to, for example, the active regions 121-122. The gate strips 531 are configured with respect to, for example, the gate structures 131-133. The conductive line 541 is configured with respect to, for example, the conductive line 141, and the conductive line 542 is configured with respect to, for example, the conductive line 143. The conductive segments 551 are configured with respect to, for example, the conductive segments 151-152. The via VD3 is configured with respect to, for example, the vias VD1-VD2. The via VB3 is configured with respect to, for example, the vias VB1-VB2. The vias VG2 are configured with respect to, for example, the via VG1. In some embodiments, the power rail 511 is arranged in a first layer. The active area 520 and the gate strips 531 are arranged in a second layer above the first layer. The conductive segments 551 are over the active area 520. The conductive lines 541-542 are arranged in a third layer above the second layer. The via VB3 is arranged between the first layer and the second layer. The vias VD3 and VG2 are arranged between the second layer and the third layer.

Figure 6C:
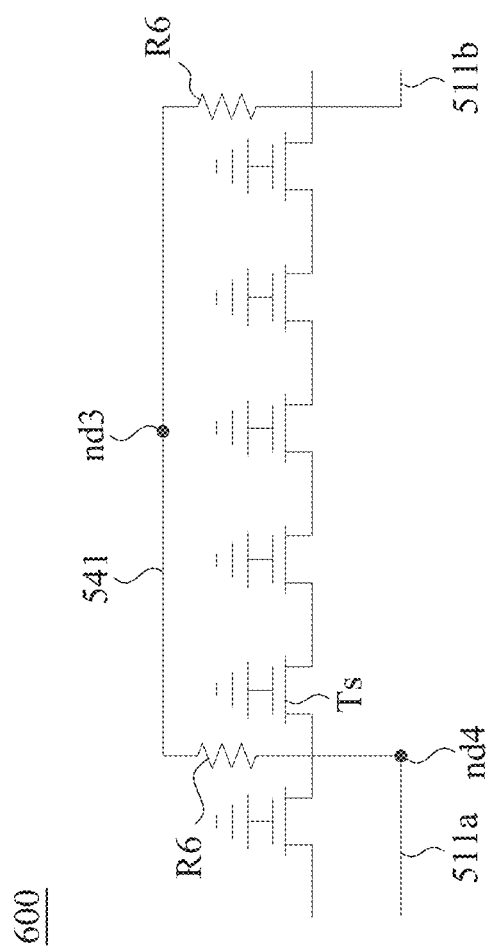
FIG. 6C is an equivalent circuit corresponding to part of the semiconductor device of FIGS. 6A-6B, in accordance with various embodiments.

In some embodiments, the conductive line 541 is referred to as the conductive line coupled to a node nd3 (as shown in FIG. 6C) and the power rail 511 is referred to as the power rail coupled to a node nd4 (as shown in FIG. 6C), in which the nodes nd3-nd4 are nodes in an integrated circuit included in the semiconductor device. In some embodiments, the node nd3 is configured to receive a supply voltage transmitted from the node nd4. In some embodiments, the conductive line 542 is configured to receive a control signal (for example, the control signal CS) in operation for controlling the transistor structure including the gate strips 531. The detailed configurations will be discussed in the following paragraphs.

As shown in FIG. 5A, the power rail 511 and the active area 520 extends in x direction, and the active area 520 overlaps the power rail 511 in the layout view. The gate strips 531 extend in y direction and cross the power rail 511. The gate strips 531 are separated from each other in x direction. The conductive lines 541-542 extend in x direction and are separated from each other in y direction. The conductive lines 541-542 partially overlap the power rail 511. In some embodiments, the power rail 511 has a width greater than width of the active area 520 and the conductive lines 541-542 in y direction.

In some embodiments, as shown in FIG. 5A, a width of the via VB3 along y direction is substantially the same with a width of the active area 520. In various embodiments, the width of the via VB3 along y direction is between the width of the active area 520 and a width of the power rail 511. In various embodiments, the via VB3 has a tapered shape.

Reference is now made to FIG. 5B. FIG. 5B is a cross-sectional view of part of the semiconductor device 500 in FIG. 5A along a line DD', in accordance with various embodiments. As shown in FIG. 5B, the conductive segment 551 is disposed on an active region 521 of the active area 520. The via VD3 is coupled between the conductive line 541 and the conductive segment 551, and accordingly, the active region 521 is coupled to the conductive line 541 through the via VD3 and the conductive segment 551. The via VB3 is coupled between the power rail 511 and active region 521.

In some embodiments, a resistance contributed by a structure of routing including, for example, the vias VD3, VB3, the active region 521, and the conductive segment 551, between the power rail 511 and the conductive line 541 is represented as a resistance unit R6. In some embodiments, the resistance unit R6 corresponds the combinations of the resistance units R1-R2 of FIG. 3C.

The configurations of FIGS. 5A-5B are given for illustrative purposes. Various implementations are within the contemplated scope of the present disclosure. For example, in some embodiments, the semiconductor device 500 further includes multiple vias which are configured with respect to the vias VD3 and VB3 and coupled to the conductive segments 551 and other active regions of the active area 520. Accordingly, more than one conductive paths are created between the power rail 511 and the conductive line 541.

Reference is now made to FIG. 6A. FIG. 6A is a layout diagram in a plan view of the semiconductor device 600, in accordance with various embodiments. With respect to the embodiments of FIGS. 5A-5B, like elements in FIG. 6A are designated with the same reference numbers for ease of understanding.

Compared with FIG. 5A, the semiconductor device 600 includes more gate strips 531 and conductive segments 551. In addition, a power rail corresponding to the power rail 511 has two portions including power rails 511a-511b in the semiconductor device 600. As shown in FIG. 6A, the power rails 511a-511b are separated from each other in x direction. The conductive line 541 overlaps both the power rails 511a-511b. Instead of having one via VD3 and one via VB3, the semiconductor device 600 further includes two vias VD3 and two vias VB2 disposed at two parts of the semiconductor device 600. Furthermore, each of the gate strips 531 is coupled with the conductive line 542 through one via VG2.

Reference is now made to FIG. 6B. FIG. 6B is a cross-sectional view of part of the semiconductor device 600 in FIG. 6A along a line EE', in accordance with various embodiments. As shown in FIG. 6B, the power rail 511a is coupled to the conductive line 541 through the vias VD3, VB3, the active region 521, and the conductive segment 551 above the power rail 511a. Similarly, the power rail 511b is coupled to the conductive line 541 through the vias VD3, VB3, the active region 521, and the conductive segment 551 above the power rail 511b. Alternatively stated, two conductive paths are created for transmitting signals from/to the conductive line 541 to/from the power rails 511a-511b.

As shown in FIG. 6B, in some embodiments, the gate strip 531 and the active regions 521 on opposite sides of the gate strip 531 are included in a structure operating as a transistor Ts. With reference to FIGS. 6B-6C, FIG. 6C is an equivalent circuit corresponding to part of the semiconductor device 600 of FIGS. 6A-6B, in accordance with various embodiments. As illustratively shown in FIG. 6C, the semiconductor device 600 includes multiple transistor Ts coupled in series.

In some embodiments, the active region 521 in FIG. 6B coupled to the via VB3 above the power rail 511a is included in a structure operating as a terminal of a first transistor of the transistors Ts in FIG. 6C. Another active region 521 in FIG. 6B coupled to the via VB3 above the power rail 511b is included in a structure operating as a terminal of a second transistor, different from the first transistor, of the transistors Ts in FIG. 6C. The gate strip 531 corresponds to a gate terminal of the transistor Ts.

In some embodiments, during operation, the gate terminals of the transistors Ts are coupled to a ground through the vias VG2 and the conductive line 542. Accordingly, the structures of the transistors Ts are configured to include decoupling capacitances while the signals are transmitted between the conductive line 541 and the power rails 511a-511b. Alternatively stated, the transistors Ts disposed beside the resistance unit R6 or the transistors Ts disposed between the resistance units R6 are tied off to include decoupling capacitances with the resistance units R6.

In some approaches, the extra area is required in an integrated circuit for decoupling capacitance and transmitting voltage from front side metal layers. With the configurations of the present disclosure, the functions of transmitting and decoupling are integrated in the semiconductor device 600.

Figure 7A:
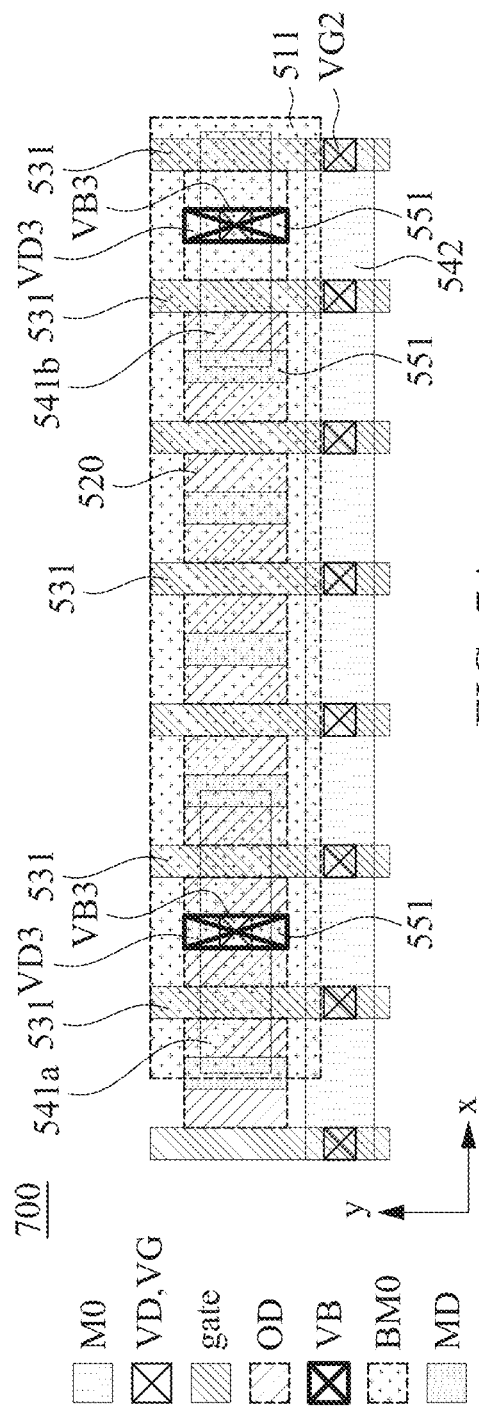
FIG. 7A is a layout diagram in a plan view of a semiconductor device, in accordance with various embodiments.

Reference is now made to FIG. 7A. FIG. 7A is a layout diagram in a plan view of the semiconductor device 700, in accordance with various embodiments. With respect to the embodiments of FIGS. 6A-6B, like elements in FIG. 7A are designated with the same reference numbers for ease of understanding.

Compared with FIG. 6A, instead of having a continuing conductive line 541 and the two-piece power rails 511a-511b, the semiconductor device 700 includes a conductive line, corresponding to the conductive line 541 of FIG. 6A, having two portions including conductive lines 541a-541b. As shown in FIG. 7A, the conductive lines 541a-541b are separated from each other in x direction. Both the conductive lines 541a-541b overlaps the power rail 511.

Figure 7B:
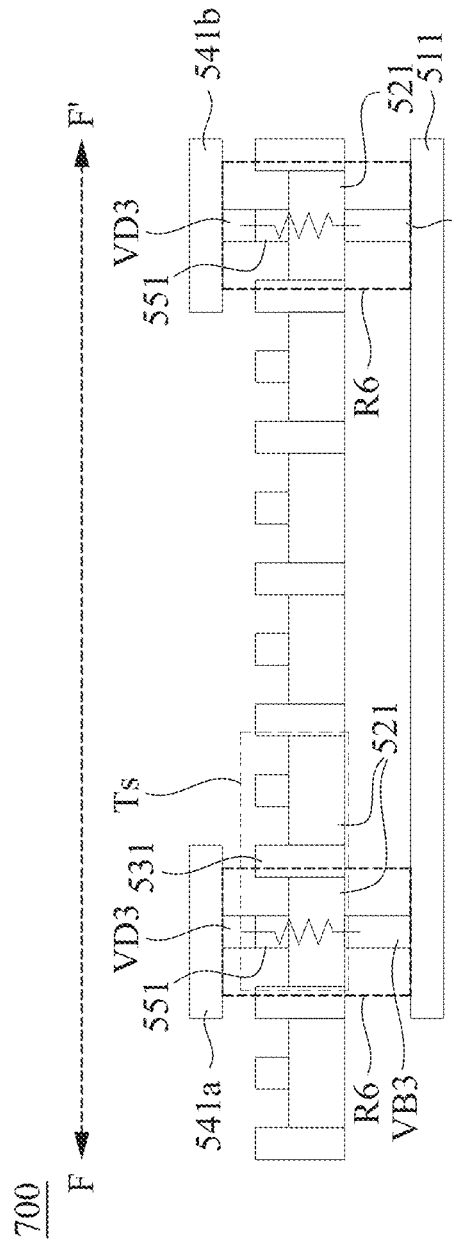
FIG. 7B is a cross-sectional view of part of the semiconductor device in FIG. 7A along a line FF', in accordance with various embodiments.

Reference is now made to FIGS. 7B-7C. FIG. 7B is a cross-sectional view of part of the semiconductor device 700 in FIG. 7A along a line FF', and FIG. 7C is an equivalent circuit corresponding to part of the semiconductor device 700 of FIGS. 7A-7B, in accordance with various embodiments. As shown in FIG. 7B, the power rail 511 is coupled to the conductive line 541a through the vias VD3, VB3, the active region 521, and the conductive segment 551 underneath the conductive line 541a. Similarly, the power rail 511 is also coupled to the conductive line 541b through the vias VD3, VB3, the active region 521, and the conductive segment 551 underneath the conductive line 541b. Alternatively stated, in some embodiments, the power rail 511 outputs/receives a signal to two devices through the separated conductive lines 541a-541b, as shown in FIG. 7C.

Figure 8A:
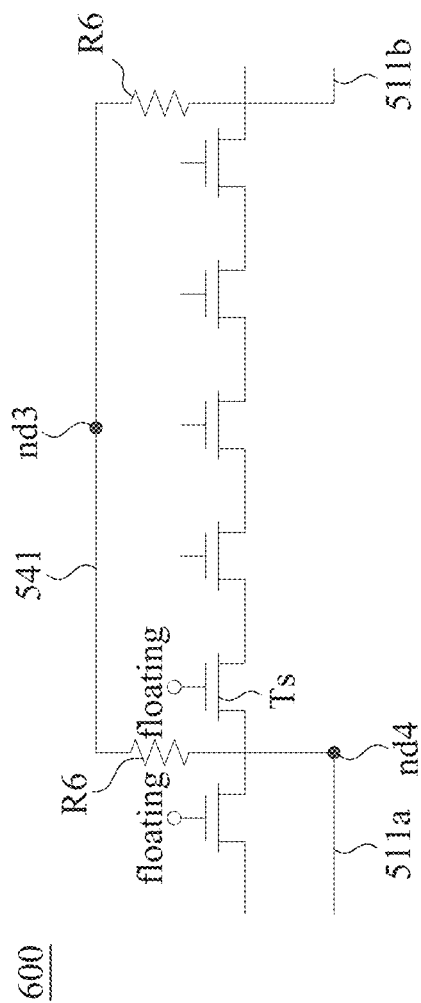
FIG. 8A is another equivalent circuit corresponding to part of the semiconductor device of FIGS. 6A-6B, in accordance with various embodiments.
Figure 8B:
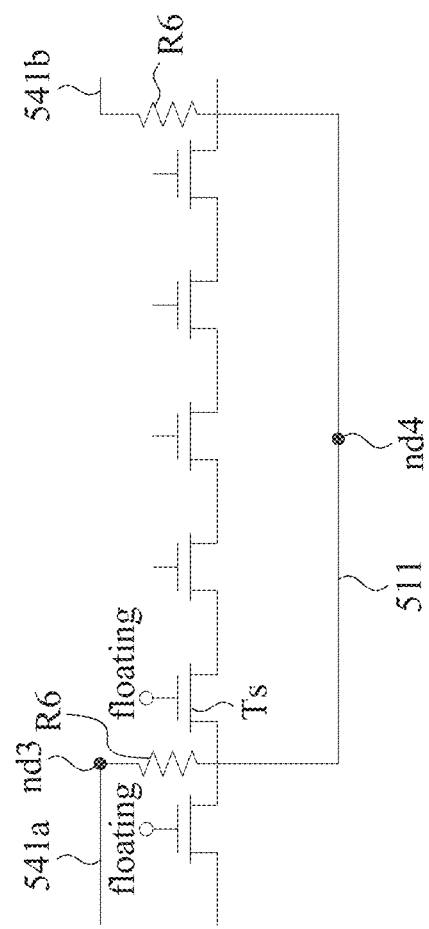
FIG. 8B is another equivalent circuit corresponding to part of the semiconductor device of FIGS. 7A-7B, in accordance with various embodiments.

The configurations of FIGS. 6A-7C are given for illustrative purposes. Various implementations are within the contemplated scope of the present disclosure. Reference is now made to FIGS. 8A-8B. FIGS. 8A-8B are equivalent circuits corresponding to part of the semiconductor devices 600-700, respectively, in accordance with various embodiments. For example, in some embodiments, as shown in FIGS. 8A-8B, during operation, the gate terminals of the transistors Ts disposed beside the resistance units R6 are floating. Accordingly, parasitic capacitances in the semiconductor devices 600-700 are minimized and the low parasitic capacitances result in high operating speed. In another embodiment, the gate terminals of the transistors Ts disposed between the resistance units R6 are floating. In still another embodiment, the gate terminals of the transistors Ts of FIGS. 8A-8B are coupled to high-resistance units.

Reference is now made to FIG. 9A. FIG. 9A is a layout diagram in a plan view of the semiconductor device 900, in accordance with various embodiments. With respect to the embodiments of FIGS. 1A-8B, like elements in FIG. 9A are designated with the same reference numbers for ease of understanding.

As shown in FIG. 9A, the semiconductor device 900 includes the cell CELL1 corresponding to one of FIG. 1A and a cell CELL2 abutting the cell CELL1 in y direction. In some embodiments, the cell CELL1 of FIG. 9A includes an active area 921 including the active regions 121-122. The cell CELL2 includes an active area 922. In some embodiments, the cell CELL2 is a mirror image across a mirror line 910 extending in x direction. Alternatively stated, a power rail 112 is configured with respect to the power rail 111 in the cell CELL1, and the power rails 111-112 are at the opposite sides of the mirror line 910 and aligned with each other. The active area 922 is configured with respect to the active area 921 in the cell CELL1, and the active areas 921-922 are at the opposite sides of the mirror line 910 and aligned with each other. A via VD4 is configured with respect to the via VD1 in the cell CELL1 and the vias VD1 and VD4 are at the opposite sides of the mirror line 910 and aligned with each other. A via VB4 is configured with respect to the via VB1 in the cell CELL1 and the vias VB1 and VB4 are at the opposite sides of the mirror line 910 and aligned with each other. The conductive lines 144 and 145 are configured with respect to the conductive lines 142 and 141 respectively, and the conductive line 143 is shared by the cells CELL1-CELL2. The gate structures 131-133 are shared by the cells CELL1-CELL2.

In some embodiments, the abutting cells CELL1-CELL2 are included in a cell CELL3 (e.g., a standard cell) for transmitting signals between the power rails 111-112 and the conductive lines 141 and 145. As shown in FIG. 9A, the cell CELL3 includes the conductive lines 141-145 arranged in 5 metal tracks, and each of the cells CELL1-CELL2 includes conductive lines in 2.5 metal tracks. Alternatively stated, a number of metal tracks included in each of the cells CELL1-CELL2 is not an integer, and a total number of metal tracks included in the cells CELL1-CELL2 is an integer. The configurations of the cells CELL1-CELL3 are given for illustrative purposes. Various implementations are within the contemplated scope of the present disclosure. For example, in some embodiments, a number of metal tracks included in each of the cells CELL1-CELL2 is an integer.

In some embodiments, the active areas 921-922 have different conductivity types. The active area 921 is of first conductivity type, for example, P-type. The active area 922 is of second conductivity type, for example, N-type.

FIG. 9B is an equivalent circuit corresponding to part of the semiconductor device 900 of FIG. 9A, in accordance with various embodiments. Reference is now made to FIGS. 9A-9B. In some embodiments, the cell CELL1 corresponds to a P-type transistor P1 coupled with the power rail 111 and the conductive line 141, and the cell CELL2 corresponds to an N-type transistor N1 coupled with the power rail 112 and the conductive line 145. In operation, according to some embodiments, the shared gate structure 132 corresponds to gate terminals of the transistors P1 and N1. A control signal S4 is transmitted to the transistors P1 and N1 by the conductive line 143. In some embodiments, when the control signal S4 has a high logic state (i.e., a logic 1), the transistor N1 is turned on to receive a voltage (e.g., a voltage VSS, in some embodiments, a ground) and provides the voltage to other devices (not shown) coupled to the semiconductor device 900 through the conductive line 145. Similarly, when the control signal S4 has a low logic state (e.g., a logic 0), the transistor P1 is turned on to receive another voltage (e.g., a voltage VDD, in some embodiments, a voltage greater than the voltage VSS) and provides the voltage to other devices (not shown) coupled to the semiconductor device 900.

The configurations of FIGS. 9A-9B are given for illustrative purposes. Various implementations are within the contemplated scopes of the present disclosure. For example, in some embodiments, the cells CELL1-CELL2 in the cell CELL3 are implemented by at least one of the semiconductor device 200 in FIGS. 2A-2C, the semiconductor device 300 in FIGS. 3A-3C, or the combinations thereof.

Figure 10A:
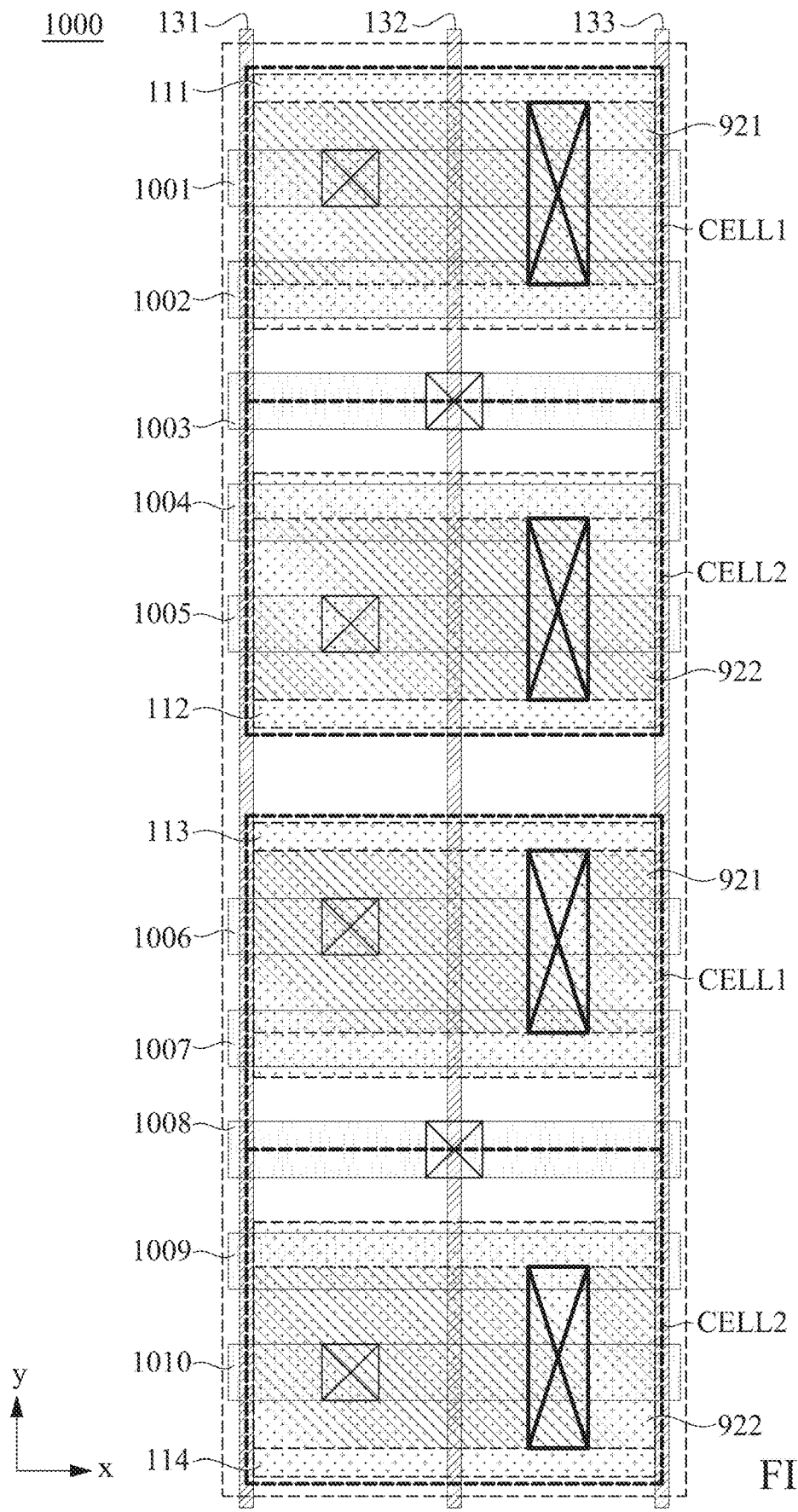
FIG. 10A is a layout diagram in a plan view of a semiconductor device, in accordance with various embodiments.

Reference is now made to FIG. 10A. FIG. 10A is a layout diagram in a plan view of the semiconductor device 1000, in accordance with various embodiments. With respect to the embodiments of FIGS. 1A-9B, like elements in FIG. 10A are designated with the same reference numbers for ease of understanding.

Compared with FIG. 9A, instead of having one cell CELL1 and one cell CELL2 in the cell CELL3, the cell CELL3 of the semiconductor device 1000 further includes multiple cells CELL1 and multiple cells CELL2. For illustration, the cells CELL1 and the cells CELL2 are interlaced. As shown in FIG. 10A, the semiconductor device 1000 further includes conductive lines 1001-1010 and power rails 113-114. In some embodiments, the conductive lines 1001-1010 are configured with respect to, for example, the conductive lines 141-145. The power rails 113-114 are configured with respect to, for example, the power rails 111-112.

For illustration, the conductive lines 1001-1005 are included in the cells CELL1-CELL2 of the upper part of the cell CELL3, and the conductive lines 1006-1010 are included in the cells CELL1-CELL2 of the bottom part of the cell CELL3. The power rails 113-114 are included in the cells CELL1-CELL2 of the bottom part of the cell CELL3 respectively. The gate structures 131-133 are further shared by all cells in the cell CELL3.

As shown in FIG. 10A, the semiconductor device 1000 further includes the active areas 921 in the cells CELL1 and the active areas 922 in the cells CELL2. In some embodiments, the active areas 921 are P-type and the active areas 922 are N-type.

Figure 10B:
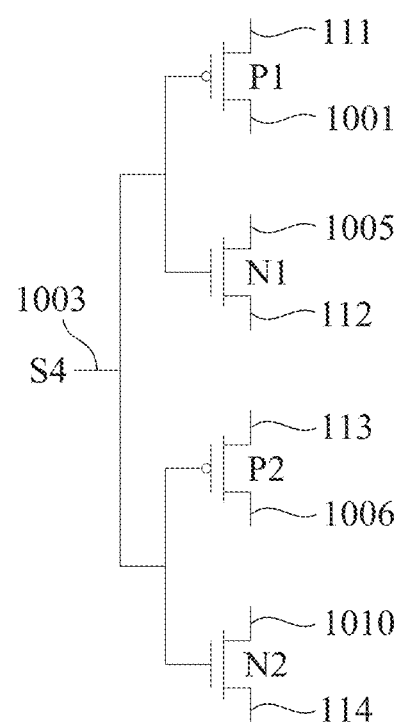
FIG. 10B is an equivalent circuit corresponding to part of the semiconductor device of FIG. 10A, in accordance with various embodiments.

With reference to FIG. 10B, FIG. 10B is an equivalent circuit corresponding to part of the semiconductor device 1000 of FIG. 10A, in accordance with various embodiments. Reference is now made to FIGS. 10A-10B. In some embodiments, the cells CELL1-CELL2 of the upper part of the cell CELL3 correspond to, respectively the P-type transistor P1 coupled with the power rail 111 and the conductive line 1001 and the N-type transistor N1 coupled with the power rail 112 and the conductive line 1005. Similarly, the cells CELL1-CELL2 of the bottom part of the cell CELL3 correspond to, respectively the P-type transistor P2 coupled with the power rail 113 and the conductive line 1006 and the N-type transistor N2 coupled with the power rail 114 and the conductive line 1010.

In operation, according to some embodiments, the shared gate structure 132 corresponds to gate terminals of the transistors P1-P2 and N1-N2. The control signal S4 is transmitted to the transistors P1-P2 and N1-N2 by the conductive line 1003 and/or the conductive line 1008. In some embodiments, when the control signal S4 has a high logic state (e.g., a logic 1), the transistors N1-N2 are turned on to receive a voltage (e.g., a voltage VSS, in some embodiments, a ground) and provides the voltage to other device (not shown) coupled to the semiconductor device 1000 through the conductive lines 1005 and 1010. Similarly, when the control signal S4 has a low logic state (e.g., a logic 0), the transistors P1-P2 are turned on to receive another voltage (e.g., a voltage VDD, in some embodiments, a voltage greater than the voltage VSS) and provides the voltage to other device (not shown) coupled to the semiconductor device 1000 through the conductive lines 1001 and 1006.

The configurations of FIGS. 10A-10B are given for illustrative purposes. Various implementations are within the contemplated scope of the present disclosure. For example, in some embodiments, a number of the cells CELL1 is equal to a number of the cells CELL2 which ranges from two to four. In some embodiments, the number of the cells CELL1 equal to the number of the cells CELL2 is greater than four.

In various embodiments, the active areas 921-922 in the cells CELL1-CELL2 of the upper part of the cell CELL3 are P-type, and the active areas 921-922 in the cells CELL1-CELL2 of the bottom part of the cell CELL3 are N-type. Alternatively stated, the active areas 921-922 in the cell CELL3 are combinations of P-type active areas and N-type active areas arranged in an arbitrary order. For example, in some embodiments, the sequence of types of the active areas 921-922, from the top of the cell CELL3 to the bottom of the cell CLEE3, can be PPNP, PNNP, PPPN, NPNP, NPPN, NPPP, or any other suitable arrangements.

Figure 11:
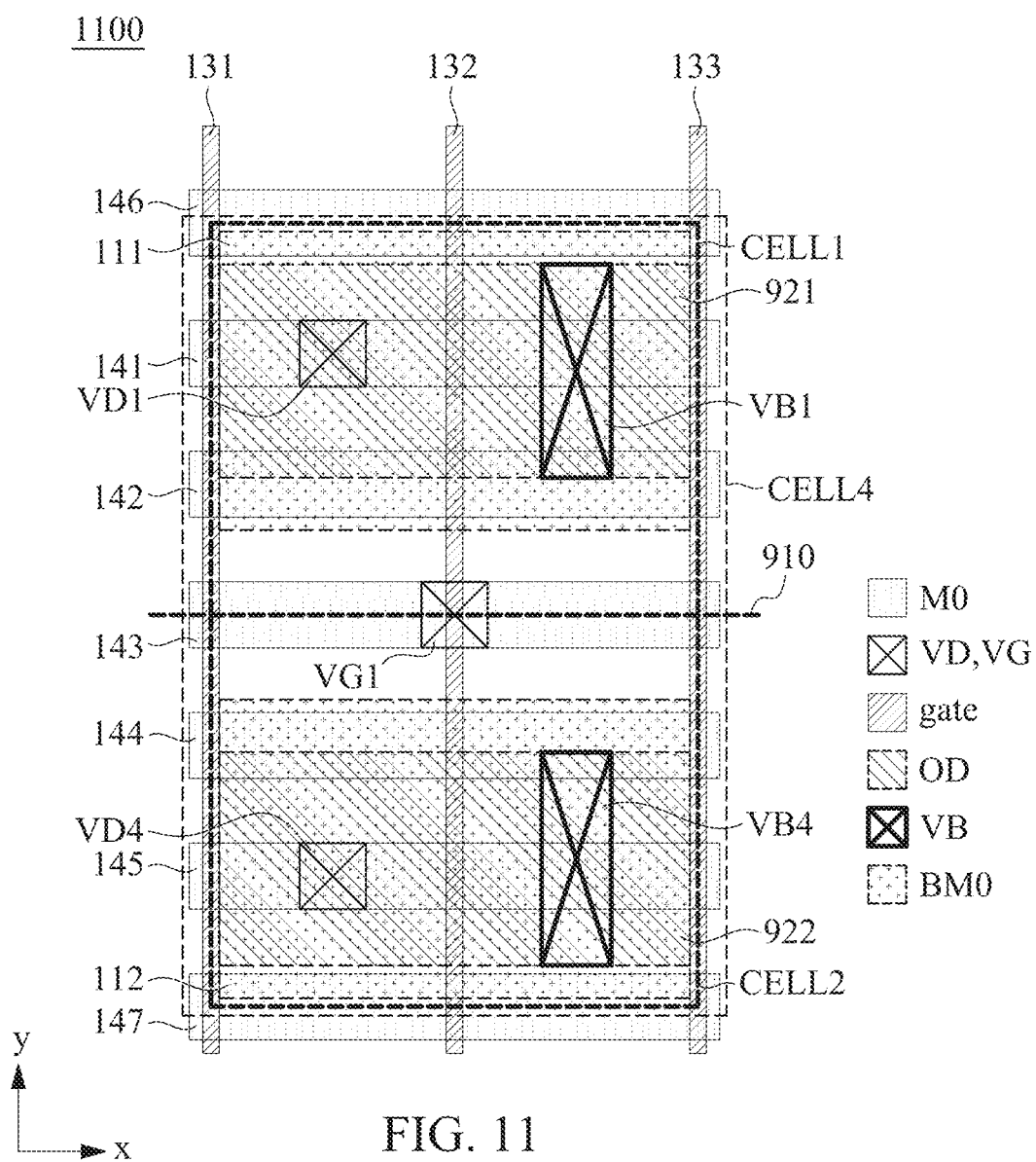
FIG. 11 is a layout diagram in a plan view of a semiconductor device, in accordance with various embodiments.

Reference is now made to FIG. 11. FIG. 11 is a layout diagram in a plan view of the semiconductor device 1100, in accordance with various embodiments. With respect to the embodiments of FIGS. 1A-10B, like elements in FIG. 11 are designated with the same reference numbers for ease of understanding.

Compared with FIG. 9A, instead of the cells CELL1-CELL2 having conductive lines arranged in 2.5 metal tracks, cells CELL1-CELL2 in a cell CELL4 have conductive lines arranged in 3 metal tracks in the semiconductor device 1100, as shown in FIG. 11. For illustration, the cell CELL1 includes the conductive lines 141, 142, half of the conductive line 143, and half of the conductive line 146. Similarly, the cell CELL2 includes the conductive lines 144, 145, half of the conductive line 143, and half of the conductive line 147.

Figure 12A:
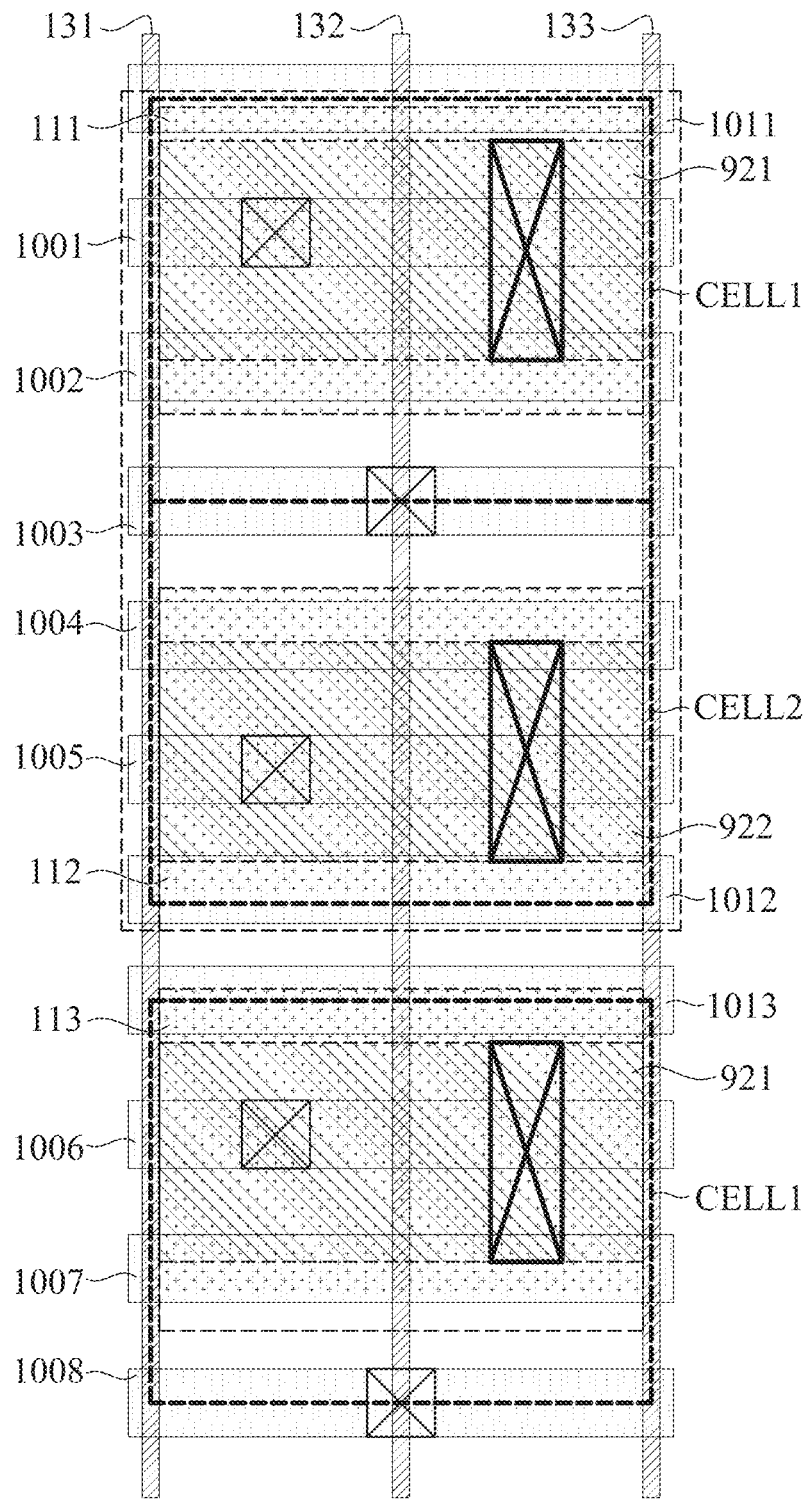
FIG. 12A is a layout diagram in a plan view of a semiconductor device, in accordance with various embodiments.

Reference is now made to FIG. 12A. FIG. 12A is a layout diagram in a plan view of the semiconductor device 1200, in accordance with various embodiments. With respect to the embodiments of FIGS. 1A-11, like elements in FIG. 12A are designated with the same reference numbers for ease of understanding.

For illustration, compared with the semiconductor device 1000 and the cell CELL4 of FIG. 11, the semiconductor device 1200 further includes the conductive lines 1011-1013. In some embodiments, the conductive lines 1001-1005, and 1011-1012 of FIG. 12A are configured with respect to, for example, the conductive lines 141-147 of FIG. 11.

For illustration, the cell CELL1 of the cell CELL4 includes the conductive lines 1001, 1002, half of the conductive line 1003, and half of the conductive line 1011. Similarly, the cell CELL2 of the cell CELL4 includes the conductive lines 1004, 1005, half of the conductive line 1003, and half of the conductive line 1012.

In addition, the semiconductor device 1200 further includes another cell CELL1 excluded from the cell CELL4 and disposed at a side, opposing the cell CELL1 included in the cell CELL4, of the cell CELL2, as shown in FIG. 12A. For illustration, the another cell CELL1 includes the conductive lines 1006, 1007, half of the conductive line 1008, and half of the conductive line 1013.

As mentioned above, compared with FIG. 10A, instead of having equal proportions of the cells CELL1 and CELL2 in the cell CELL3 in some embodiments, the semiconductor device 1200 includes different ratios of cells of different conductivity types. For illustration, the semiconductor device 1200 of FIG. 12A includes two cells CELL1 and one cell CELL2. In some embodiments, the active areas 921 are P-type and the active area 922 is N-type.

Figure 12B:
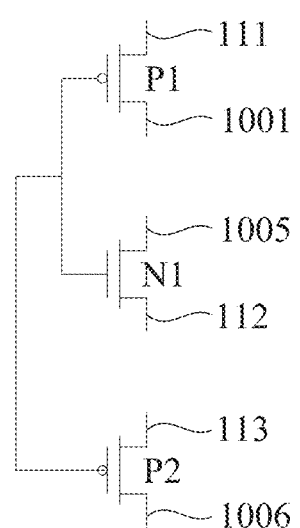
FIG. 12B is an equivalent circuit corresponding to part of the semiconductor device of FIG. 12A, in accordance with various embodiments.

With reference to FIG. 12B, FIG. 12B is an equivalent circuit corresponding to part of the semiconductor device 1200 of FIG. 12A, in accordance with various embodiments. Reference is now made to FIGS. 12A-12B. In some embodiments, the cells CELL1-CELL2 of the cell CELL4 correspond to, respectively the P-type transistor P1 coupled with the power rail 111 and the conductive line 1001 and the N-type transistor N1 coupled with the power rail 112 and the conductive line 1005. The cell CELL1 excluded from the cell CELL4 corresponds to the P-type transistor P2 coupled with the power rail 113 and the conductive line 1006.

In operation, according to some embodiments, the shared gate structure 132 corresponds to gate terminals of the transistors P1-P2 and N1. The control signal S4 is transmitted to the transistors P1-P2 and N1 by the conductive line 1003 and/or the conductive line 1008. In some embodiments, when the control signal S4 has a high logic state (e.g., a logic 1), the transistor N1 is turned on to receive a voltage (e.g., a voltage VSS, in some embodiments, a ground) and provides the voltage to other device (not shown) coupled to the semiconductor device 1200 through the conductive line 1005. Similarly, when the control signal S4 has a low logic state (e.g., a logic 0), the transistors P1-P2 are turned on to receive another voltage (e.g., a voltage VDD, in some embodiments, a voltage greater than the voltage VSS) and provides the voltage to other device (not shown) coupled to the semiconductor device 1200 through the conductive lines 1001 and 1006.

The configurations of FIGS. 12A-12B are given for illustrative purposes. Various implementations are within the contemplated scope of the present disclosure. For example, in some embodiments, the semiconductor device 1200 includes a number of P-type transistors greater than a number of N-type transistors or a number of N-type transistors greater than a number of P-type transistors. In some embodiments, the number of a first type of the P-type or N-type transistors ranges from two to four and the number of the second type of the P-type or N-type transistors ranges from one to three.

Reference is now made to FIG. 13A. FIG. 13A is a flow chart of a method 1300A of forming an integrated circuit included in a semiconductor device, for example, 300-600, or 700, in accordance with some embodiments of the present disclosure. It is understood that additional operations can be provided before, during, and/or after the processes shown by FIG. 13A, and some of the operations described below can be replaced or eliminated, for additional embodiments of the method. The order of the operations/processes may be interchangeable. Throughout the various views and illustrative embodiments, like reference numbers are used to designate like elements. The method 1300A includes operations 1310, 1320, and 1321-1325 that are described below with reference to the integrated circuit 400 of FIG. 4 and the semiconductor device 600 of FIGS. 6A-6C, as a non-limiting example.

In some embodiments, some or all of method 1300A is executed by a processor of a computer. In some embodiments, some or all of method 1300A is executed by a processor 1402 of an electronic design automation (EDA) system 1400, discussed below with respect to FIG. 14.

In operation 1310, the connection configuration between a node nd1 and a node nd2 in the integrated circuit 400 shown in FIG. 4 is identified. For illustration, the node nd1 receives the voltage V1 and is coupled to the nd2 through the resistance unit R4.

In operation 1320, in response to the connection configuration indicating that the node nd2 is configured to receive the voltage V1 transmitted from the node nd1, a layout design of the integrated circuit is generated, for example, as shown in part in FIG. 3A.

Moreover, in some embodiments, the generating the layout design includes the operation 1321, in which the conductive line 141 extending along x direction in the first layer at the front side of the integrated circuit 400 is generated to be coupled to the node nd2, as shown FIG. 3A.

Subsequently, in some embodiments, the generating the layout design further includes the operation 1322, in which the power rail 111 extending along x direction in a second layer, below the first layer, at the back side of the integrated circuit 400 is generated to be coupled to the node nd1.

The generating the layout design further includes the operation 1323, in some embodiments, in which the active area 120 is generated extending along x direction in a third layer, between the first and second layers.

The generating the layout design further includes the operation 1324, in some embodiments, in which the via VD1 is generated to be coupled between the active region 121 and the conductive line 141, and in some embodiments, the via VD2 is generated to be coupled between the active region 122 and the conductive line 141, as shown in FIGS. 3A-3B.

The generating the layout design further includes the operation 1325, in some embodiments, in which the via VB1 is generated to be coupled between the active region 122 and the power rail 111, and in some embodiments, the via VB2 is generated to be coupled between the active region 121 and the power rail 111, as shown in FIGS. 3A-3B. In some embodiments, along the y direction, the active area 120 and the vias VB1-VB2 have a same width. In some embodiments, as shown in FIG. 3A, the via VD1 overlaps the via VB2, and the via VD2 overlaps the via VB1.

In some embodiments, the generating the layout design of the method 1300A further includes generating multiple gate strips 531 which extend in y direction and generating the conductive line 542, as shown in FIG. 6A. For illustration, the gate strips 531 extend in y direction and are interposed between the vias VD3 which couples the active regions 521 to the conductive line 541. The gate strips 531 are coupled to the conductive line 542 through the vias VG2.

In some embodiments, as shown in FIG. 6A, the generating the power rail 511 includes generating the power rail 511a (the first portion of the power rail 511) and the power rail 511b (the second portion of the power rail 511, separated from the first portion). In some embodiments, patterns corresponding to the power rail 511a, the vias VD3, VB3 that are above the power rail 511a are overlapped with each other in FIG. 6A. Similarly, in some embodiments, patterns corresponding to the power rail 511b, and the vias VD3, VB3 that are above the power rail 511b are overlapped with each other in FIG. 6A.

In some embodiments, the method 1300A further includes one or more operations of manufacturing at least one element of the integrated circuit, for example, the integrated circuit 400, based on the layout design, as part of an IC manufacturing flow, e.g., an IC manufacturing flow corresponding to an IC manufacturing system 1500 discussed below with respect to FIG. 15.

Figure 13B:
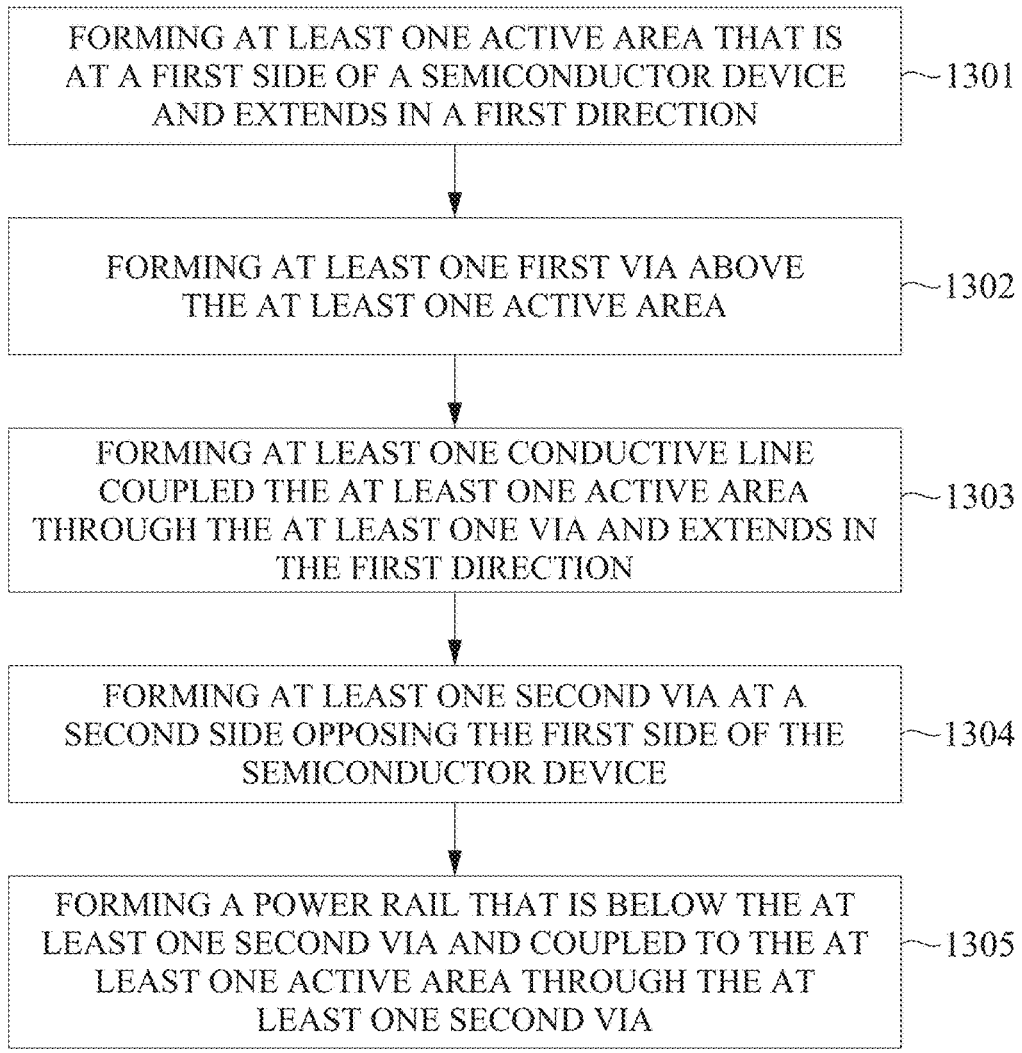
FIG. 13B is a flow chart of a method of fabricating a semiconductor device, in accordance with some embodiments of the present disclosure.

Reference is now made to FIG. 13B. FIG. 13B is a flow chart of a method 1300B of fabricating the semiconductor devices 100-700, or 900-1200, in accordance with some embodiments of the present disclosure. It is understood that additional operations can be provided before, during, and/or after the processes shown by FIG. 13B, and some of the operations described below can be replaced or eliminated, for additional embodiments of the method. The order of the operations/processes may be interchangeable. Throughout the various views and illustrative embodiments, like reference numbers are used to designate like elements. The method 1300B includes operations 1301-1305 that are described below with reference to the semiconductor device 500 as a non-limiting example.

In some embodiments, method 1300B is usable by an IC manufacturing system as part of an IC manufacturing flow, e.g., IC manufacturing system 1500 discussed below with respect to FIG. 15.

In operation 1301, an active area, e.g., the active area 520, is formed at a first side (e.g., a front side above the via VB) of the semiconductor device 500 and extends in x direction, as shown in FIG. 5B.

In some embodiments, the method 1300B further includes forming one or more conductive segments, e.g., the conductive segments 551, on the active area, e.g., the active area 520.

In operation 1302, a via, e.g., the via VD3, is formed on the conductive segment, e.g., the conductive segment 551, above an active region of the active area, e.g., the active region 521 of the active area 520.

In operation 1303, a conductive line, e.g., the conductive line 541, is formed above and coupled to the active area through the via, e.g., the active area 520 through the via VD3. The conductive line, e.g., conductive line 541 extends in x direction.

In some embodiments, after the manufacturing processes for components (i.e., active devices) at the front side of the semiconductor device, e.g., the semiconductor device 500, is complete, a substrate (not shown) is removed and the wafer is flipped upside down for manufacturing process performing at the backside of the semiconductor device, e.g., the semiconductor device 500.

In operation 1304, a back-side via, e.g., the via VB3, is formed at a second side (i.e., a back side below the active area 520) opposing the first side of the semiconductor device 500.

In operation 1305, a power rail, e.g., the power rail 511, is formed below the back-side via, e.g., the via VB3, and coupled to the active area, e.g., the active area 520, through the back-side via, as shown in FIG. 5B. In some embodiments, after the wafer is flipped, the power rail is formed above the back-side via.

In some embodiments, the method 1300B further includes forming multiple back-side vias, e.g., the multiple vias VB3, in operation 1304. As shown in FIG. 6B, one of the vias VB3 is formed to couple the active region 521 and the power rail 511a, and the other is formed to couple another active region 510 and the power rail 511b. In some embodiments, the method 1300B further includes forming gate strips, e.g., the gate strips 531, between the back-side vias.

In some embodiments, the method 1300B further includes forming conductive lines that are arranged in multiple, e.g., three metal tracks above the power rail. For example, as shown in FIG. 11, the conductive lines 141-142 and 146 are arranged in three metal tracks above the power rail 111. Similarly, the conductive lines 144-145 and 147 are arranged in three metal tracks above the power rail 112.

In some embodiments, the method 1300B further includes forming multiple active areas of a first conductivity type and multiple active areas of a second conductivity type different from the first conductivity type. For example, as shown in FIG. 12A, the active areas 921 are P-type and the active area 922 is N-type. A number of the active areas 921 (e.g., 2) is greater than a number of the active areas 922 (e.g., 1.)

Figure 14:
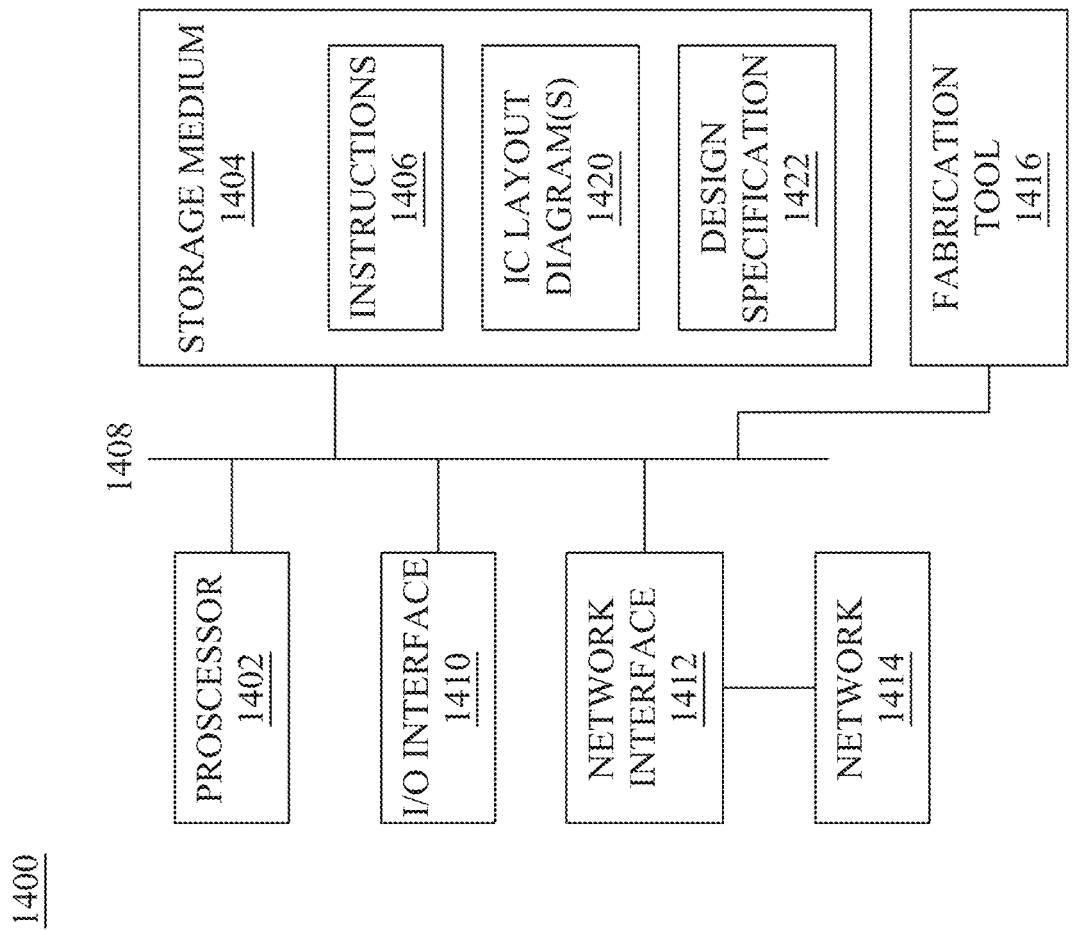
FIG. 14 is a block diagram of a system for designing the integrated circuit layout design, in accordance with some embodiments of the present disclosure.

Reference is now made to FIG. 14. FIG. 14 is a block diagram of EDA system 1400 capable of designing an integrated circuit layout design, in accordance with some embodiments of the present disclosure. EDA system 1400 is configured to implement one or more operations of the method 1300A disclosed in FIG. 13A, and further explained in conjunction with FIGS. 1A-12B. In some embodiments, EDA system 1400 includes an APR system.

In some embodiments, EDA system 1400 is a general purpose computing device including a hardware processor 1402 and a non-transitory, computer-readable storage medium 1404. Storage medium 1404, amongst other things, is encoded with, i.e., stores, computer program code (instructions) 1406, i.e., a set of executable instructions. Execution of instructions 1406 by hardware processor 1402 represents (at least in part) an EDA tool which implements a portion or all of a method, e.g., the method 1300A.

The processor 1402 is electrically coupled to computer-readable storage medium 1404 via a bus 1408. The processor 1402 is also electrically coupled to an I/O interface 1410 and a fabrication tool 1416 by bus 1408. A network interface 1412 is also electrically connected to processor 1402 via bus 1408. Network interface 1412 is connected to a network 1414, so that processor 1402 and computer-readable storage medium 1404 are capable of connecting to external elements via network 1414. The processor 1402 is configured to execute computer program code 1406 encoded in computer-readable storage medium 1404 in order to cause EDA system 1400 to be usable for performing a portion or all of the noted processes and/or methods. In one or more embodiments, processor 1402 is a central processing unit (CPU), a multi-processor, a distributed processing system, an application specific integrated circuit (ASIC), and/or a suitable processing unit.

In one or more embodiments, computer-readable storage medium 1404 is an electronic, magnetic, optical, electromagnetic, infrared, and/or a semiconductor system (or apparatus or device). For example, computer-readable storage medium 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1404 includes a compact disk-read only memory (CD-ROM), a compact disk-read/write (CD-R/W), and/or a digital video disc (DVD).

In one or more embodiments, storage medium 1404 stores computer program code 1406 configured to cause EDA system 1400 (where such execution represents (at least in part) the EDA tool) to be usable for performing a portion or all of the noted processes and/or methods. In one or more embodiments, storage medium 1404 also stores information which facilitates performing a portion or all of the noted processes and/or methods. In one or more embodiments, storage medium 1404 stores IC layout diagram 1420 of standard cells including such standard cells as disclosed herein, for example, a cell(s) including in the semiconductor devices 100-700 and 900-1200 discussed above with respect to FIGS. 1A-12B.

EDA system 1400 includes I/O interface 1410. I/O interface 1410 is coupled to external circuitry. In one or more embodiments, I/O interface 1410 includes a keyboard, keypad, mouse, trackball, trackpad, touchscreen, and/or cursor direction keys for communicating information and commands to processor 1402.

EDA system 1400 also includes network interface 1412 coupled to processor 1402. Network interface 1412 allows EDA system 1400 to communicate with network 1414, to which one or more other computer systems are connected. Network interface 1412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1400.

In some embodiments, EDA system 1400 also includes the fabrication tool 1416 coupled to processor 1402. The fabrication tool 1416 is configured to fabricate integrated circuits, e.g., the semiconductor device 100-700 and 900-1200 illustrated in FIGS. 1A-12B, according to the design files processed by the processor 1402.

EDA system 1400 is configured to receive information through I/O interface 1410. The information received through I/O interface 1410 includes one or more of instructions, data, design rules, libraries of standard cells, and/or other parameters for processing by processor 1402. The information is transferred to processor 1402 via bus 1408. EDA system 1400 is configured to receive information related to a UI through I/O interface 1410. The information is stored in computer-readable medium 1404 as design specification 1422.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1400. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 15:
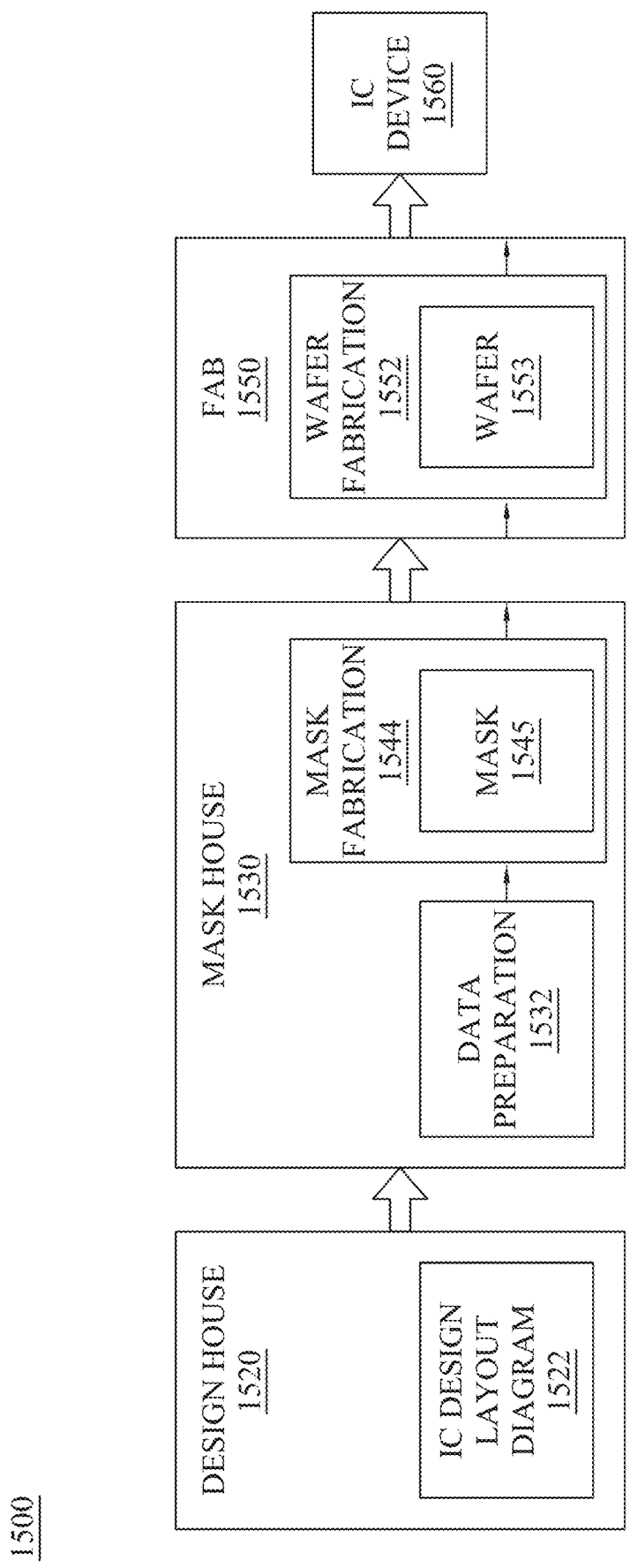
FIG. 15 is a block diagram of an integrated circuit manufacturing system, and an integrated circuit manufacturing flow associated therewith, in accordance with some embodiments.

FIG. 15 is a block diagram of IC manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1500.

In FIG. 15, IC manufacturing system 1500 includes entities, such as a design house 1520, a mask house 1530, and an IC manufacturer/fabricator ("fab") 1550, that interact with one another in the design, development, and manufacturing cycles and/or services related to manufacturing an IC device 1560. The entities in IC manufacturing system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1520, mask house 1530, and IC fab 1550 is owned by a single larger company. In some embodiments, two or more of design house 1520, mask house 1530, and IC fab 1550 coexist in a common facility and use common resources.

Design house (or design team) 1520 generates an IC design layout diagram 1522. IC design layout diagram 1522 includes various geometrical patterns, for example, an layout design depicted in FIGS. 1B, 2B, 3B, 5A, 6A, 7A, 9A, 10 A, 11, and/or 12A, designed for an IC device 1560, for example, the semiconductor devices 100-700 and 900-1200 in FIGS. 1A-12B. The geometrical patterns correspond to patterns of metal, oxide, or semiconductor layers that make up the various components of IC device 1560 to be fabricated. The various layers combine to form various IC features. For example, a portion of IC design layout diagram 1522 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1520 implements a proper design procedure to form IC design layout diagram 1522. The design procedure includes one or more of logic design, physical design or place and route. IC design layout diagram 1522 is presented in one or more data files having information of the geometrical patterns. For example, IC design layout diagram 1522 can be expressed in a GDSII file format or DFII file format.

Mask house 1530 includes data preparation 1532 and mask fabrication 1544. Mask house 1530 uses IC design layout diagram 1522 to manufacture one or more masks 1545 to be used for fabricating the various layers of IC device 1560 according to IC design layout diagram 1522. Mask house 1530 performs mask data preparation 1532, where IC design layout diagram 1522 is translated into a representative data file ("RDF"). Mask data preparation 1532 provides the RDF to mask fabrication 1544. Mask fabrication 1544 includes a mask writer. A mask writer converts the RDF to an image on a substrate, such as a mask (reticle) 1545 or a semiconductor wafer 1553. The IC design layout diagram 1522 is manipulated by mask data preparation 1532 to comply with particular characteristics of the mask writer and/or requirements of IC fab 1550. In FIG. 15, data preparation 1532 and mask fabrication 1544 are illustrated as separate elements. In some embodiments, data preparation 1532 and mask fabrication 1544 can be collectively referred to as mask data preparation.

In some embodiments, data preparation 1532 includes optical proximity correction (OPC) which uses lithography enhancement techniques to compensate for image errors, such as those that can arise from diffraction, interference, other process effects and the like. OPC adjusts IC design layout diagram 1522. In some embodiments, data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1532 includes a mask rule checker (MRC) that checks the IC design layout diagram 1522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1522 to compensate for limitations during mask fabrication 1544, which may undo part of the modifications performed by OPC in order to meet mask creation rules.

In some embodiments, data preparation 1532 includes lithography process checking (LPC) that simulates processing that will be implemented by IC fab 1550 to fabricate IC device 1560. LPC simulates this processing based on IC design layout diagram 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1522.

It should be understood that the above description of data preparation 1532 has been simplified for the purposes of clarity. In some embodiments, data preparation 1532 includes additional features such as a logic operation (LOP) to modify the IC design layout diagram 1522 according to manufacturing rules. Additionally, the processes applied to IC design layout diagram 1522 during data preparation 1532 may be executed in a variety of different orders.

After data preparation 1532 and during mask fabrication 1544, a mask 1545 or a group of masks 1545 are fabricated based on the modified IC design layout diagram 1522. In some embodiments, mask fabrication 1544 includes performing one or more lithographic exposures based on IC design layout diagram 1522. In some embodiments, an electron-beam (e-beam) or a mechanism of multiple e-beams is used to form a pattern on a mask (photomask or reticle) 1545 based on the modified IC design layout diagram 1522. Mask 1545 can be formed in various technologies. In some embodiments, mask 1545 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1545 includes a transparent substrate (for example, fused quartz) and an opaque material (for example, chromium) coated in the opaque regions of the binary mask. In another example, mask 1545 is formed using a phase shift technology. In a phase shift mask (PSM) version of mask 1545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1544 is used in a variety of processes. For example, such a mask(s) is used in an ion implantation process to form various doped regions in semiconductor wafer 1553, in an etching process to form various etching regions in semiconductor wafer 1553, and/or in other suitable processes.

IC fab 1550 includes wafer fabrication 1552. IC fab 1550 is an IC fabrication business that includes one or more manufacturing facilities for the fabrication of a variety of different IC products. In some embodiments, IC Fab 1550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

In some embodiments, IC fab 1550 includes fabrication tools configured to execute various manufacturing operations on semiconductor wafer 1553 such that IC device 1560 is fabricated in accordance with the mask(s), e.g., mask 1545. In various embodiments, fabrication tools include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1550 uses mask(s) 1545 fabricated by mask house 1530 to fabricate IC device 1560. Thus, IC fab 1550 at least indirectly uses IC design layout diagram 1522 to fabricate IC device 1560. In some embodiments, semiconductor wafer 1553 is fabricated by IC fab 1550 using mask(s) 1545 to form IC device 1560. In some embodiments, the IC fabrication includes performing one or more lithographic exposures based at least indirectly on IC design layout diagram 1522. Semiconductor wafer 1553 includes a silicon substrate or other proper substrate having material layers formed thereon. Semiconductor wafer 1553 further includes one or more of various doped regions, dielectric features, multi-level interconnects, and the like (formed at subsequent manufacturing steps).

As described above, semiconductor devices in the present disclosure provide a backside power rail(s) in analog cells to transmit power signals to active devices at front side. With the configurations of the present disclosure, shorter routing between the active devices and the power rail results in faster performance speed. Moreover, by disposing the power rails at the back side of the semiconductor devices, front side area can be utilized more effectively.

In some embodiments, a semiconductor device includes a first conductive line extending in a first direction on a front side of a semiconductor wafer, a first power rail extending in the first direction on a back side of the semiconductor wafer, and a first transistor including a first gate structure extending in a second direction perpendicular to the first direction, first and second active regions adjacent to the first gate structure, and a first channel region extending between the first and second active regions through the first gate structure, a first via positioned between and electrically connecting the first active region and the first conductive line, and a second via positioned between and electrically connecting the second active region and the first power rail. In some embodiments, the first channel region is a first channel region of a plurality of channel regions extending between the first and second active regions through the first gate structure. In some embodiments, the first transistor includes a first n-type transistor, and the semiconductor device includes a second power rail extending in the first direction on the back side of the semiconductor wafer, and first and second signal paths coupled between the second power rail and the first conductive line, each of the first and second signal paths including a metal line positioned on the front side of the semiconductor wafer, a resistance structure coupled between the second power rail and the metal line, and a second n-type transistor coupled between the metal line and the first conductive line. In some embodiments, the resistance structure of each of the first and second signal paths includes a third conductive line extending in the first direction on the front side of the semiconductor wafer, a second transistor including a second gate structure extending in the second direction, third and fourth active regions adjacent to the second gate structure, and a second channel region extending between the third and fourth active regions through the second gate structure, third and fourth vias positioned between and electrically connecting the respective third and fourth active regions and the third conductive line, and fifth and sixth vias positioned between and electrically connecting the respective third and fourth active regions and the second power rail. In some embodiments, an entirety of the second n-type transistor of each of the first and second signal paths is positioned on the front side of the semiconductor wafer. In some embodiments, the semiconductor device includes second through fifth conductive lines extending in the first direction on the front side of the semiconductor wafer in a same first layer as the first conductive line, a second power rail extending in the first direction on the back side of the semiconductor wafer, a second transistor including the first gate structure, third and fourth active regions adjacent to the first gate structure, and a second channel region extending between the third and fourth active regions through the first gate structure, a third via positioned between and electrically connecting the third active region and the fifth conductive line, a fourth via positioned between and electrically connecting the fourth active region and the second power rail, and a fifth via positioned between and electrically connecting the first gate structure and the third conductive line, wherein the second conductive line is positioned between the first and third conductive lines, and the fourth conductive line is positioned between the third and fifth conductive lines. In some embodiments, the first and second conductive lines are a total of two conductive lines in the first layer overlying the first and second active areas, and the fourth and fifth conductive lines are a total of two conductive lines in the first layer overlying the third and fourth active areas. In some embodiments, the semiconductor device includes sixth and seventh conductive lines extending in the first direction on the front side of the semiconductor wafer in the first layer, wherein the first through fifth conductive lines are positioned between the sixth and seventh conductive lines, the first, second, and sixth conductive lines are a total of three conductive lines in the first layer overlying the first and second active areas, and the fourth, fifth, and seventh conductive lines are a total of three conductive lines in the first layer overlying the third and fourth active areas. In some embodiments, the first transistor includes one of an n-type or p-type transistor, and the second transistor comprises the other of the n-type or p-type transistor. In some embodiments, the semiconductor device includes a sixth conductive line extending in the first direction on the front side of the semiconductor wafer in the first layer, a third power rail extending in the first direction on the back side of the semiconductor wafer, a third transistor including the first gate structure, fifth and sixth active regions adjacent to the first gate structure, and a third channel region extending between the fifth and sixth active regions through the first gate structure, a sixth via positioned between and electrically connecting the fifth active region and the sixth conductive line, and a seventh via positioned between and electrically connecting the sixth active region and the third power rail.

In some embodiments, a semiconductor device includes a first conductive line positioned on a front side of a semiconductor wafer, a first power rail positioned on a back side of the semiconductor wafer, and a first transistor positioned on the front side of the semiconductor wafer, the first transistor including a first gate structure, first and second active regions adjacent to the first gate structure, and a first channel region extending between the first and second active regions through the first gate structure, a first via positioned between and electrically connecting the first active region and the first conductive line, and a second via positioned between and electrically connecting the first active region and the first power rail. In some embodiments, the semiconductor device includes a plurality of second transistors positioned on the front side of the semiconductor wafer and aligned with and adjacent to the first transistor, wherein the plurality of second transistors includes a corresponding plurality of gate structures including the first gate structure. In some embodiments, the semiconductor device includes a second conductive line positioned on the front side of the semiconductor wafer and configured to a have a ground voltage level, and a plurality of third vias positioned between and electrically connecting corresponding gate structures of the plurality of gate structures and the second conductive line. In some embodiments, the gate structures of the plurality of gate structures are configured to float. In some embodiments, the semiconductor device includes a second power rail positioned on the back side of the semiconductor wafer, a third transistor positioned on the front side of the semiconductor wafer and aligned with and adjacent to the plurality of second transistors, the third transistor including a second gate structure, wherein the plurality of gate structures includes the second gate structure, third and fourth active regions adjacent to the second gate structure, and a second channel region extending between the third and fourth active regions through the second gate structure, a fourth via positioned between and electrically connecting the third active region and the first conductive line, and a fifth via positioned between and electrically connecting the third active region and the second power rail. In some embodiments, the semiconductor device includes a second conductive line positioned on the front side of the semiconductor wafer, a third transistor positioned on the front side of the semiconductor wafer and aligned with and adjacent to the plurality of second transistors, the third transistor including a second gate structure, wherein the plurality of gate structures includes the second gate structure, third and fourth active regions adjacent to the second gate structure, and a second channel region extending between the third and fourth active regions through the second gate structure, a fourth via positioned between and electrically connecting the third active region and the second conductive line, and a fifth via positioned between and electrically connecting the third active region and the first power rail. In some embodiments, the semiconductor device includes a third via positioned between and electrically connecting the second active region and the first conductive line, and a fourth via positioned between and electrically connecting the second active region and the first power rail.

In some embodiments, method of manufacturing a semiconductor device includes fabricating a first transistor by forming first and second active areas in a semiconductor wafer, forming a gate structure extending in a first direction, forming a first channel region extending between the first and second active areas through the gate structure, and forming a first conductive segment on the first active area, forming a first via on the first conductive segment, forming a first conductive line on the first via and extending in a second direction perpendicular to the first direction on a front side of the semiconductor wafer, forming a second via on the second active area and extending to a back side of the semiconductor wafer, and forming a first power rail on the second via and extending in the second direction on the back side of the semiconductor wafer. In some embodiments, fabricating the first transistor includes forming a second conductive segment on the second active area, forming the first via on the first conductive segment includes forming a third via on the second conductive segment, forming the first conductive line on the first via includes forming the first conductive line on the third via, forming the second via on the second active area includes forming a fourth via on the first active area and extending to the back side of the semiconductor wafer, and forming the first power rail on the second via includes forming the first power rail on the fourth via. In some embodiments, fabricating the first transistor includes fabricating a second transistor by forming third and fourth active areas in the semiconductor wafer, forming a second gate structure extending in the first direction, forming a second channel region extending between the third and fourth active areas through the gate structure, and forming a second conductive segment on the third active area, forming the first via includes forming a third via on the second conductive segment, forming the first conductive line includes forming a second conductive line on the third via and extending in the second direction on the front side of the semiconductor wafer, forming the second via includes forming a fourth via on the fourth active area and extending to the back side of the semiconductor wafer, and forming the first power rail includes forming a second power rail on the fourth via and extending in the second direction on the back side of the semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a first conductive line extending in a first direction on a front side of a semiconductor wafer;
a first power rail extending in the first direction on a back side of the semiconductor wafer;
a first transistor comprising:
a first gate structure extending in a second direction perpendicular to the first direction;
first and second active regions adjacent to the first gate structure; and
a first channel region extending between the first and second active regions through the first gate structure;

a first via positioned between and electrically connecting the first active region and the first conductive line; and a second via positioned between and electrically connecting the second active region and the first power rail, the second via extending at least partially through the semiconductor wafer.

2. The semiconductor device of claim 1, wherein the first channel region is a first channel region of a plurality of channel regions extending between the first and second active regions through the first gate structure.

3. The semiconductor device of claim 1, wherein the first transistor comprises a first n-type transistor, and the semiconductor device further comprises:

a second power rail extending in the first direction on the back side of the semiconductor wafer; and first and second signal paths coupled between the second power rail and the first conductive line, each of the first and second signal paths comprising:

a metal line positioned on the front side of the semiconductor wafer;

a resistance structure coupled between the second power rail and the metal line; and a second n-type transistor coupled between the metal line and the first conductive line.

4. The semiconductor device of claim 3, wherein the resistance structure of each of the first and second signal paths comprises:

a third conductive line extending in the first direction on the front side of the semiconductor wafer;

a second transistor comprising:

a second gate structure extending in the second direction;

third and fourth active regions adjacent to the second gate structure; and a second channel region extending between the third and fourth active regions through the second gate structure;

third and fourth vias positioned between and electrically connecting the respective third and fourth active regions and the third conductive line; and fifth and sixth vias positioned between and electrically connecting the respective third and fourth active regions and the second power rail.

5. The semiconductor device of claim 3, wherein an entirety of the second n-type transistor of each of the first and second signal paths is positioned on the front side of the semiconductor wafer.

6. The semiconductor device of claim 1, further comprising:

second through fifth conductive lines extending in the first direction on the front side of the semiconductor wafer in a same first layer as the first conductive line;

a second power rail extending in the first direction on the back side of the semiconductor wafer;

a second transistor comprising:

the first gate structure;

third and fourth active regions adjacent to the first gate structure; and a second channel region extending between the third and fourth active regions through the first gate structure;

a third via positioned between and electrically connecting the third active region and the fifth conductive line;

a fourth via positioned between and electrically connecting the fourth active region and the second power rail; and a fifth via positioned between and electrically connecting the first gate structure and the third conductive line, wherein the second conductive line is positioned between the first and third conductive lines, and the fourth conductive line is positioned between the third and fifth conductive lines.

7. The semiconductor device of claim 6, wherein the first and second conductive lines are a total of two conductive lines in the first layer overlying the first and second active regions, and the fourth and fifth conductive lines are a total of two conductive lines in the first layer overlying the third and fourth active regions.

8. The semiconductor device of claim 6, further comprising:

sixth and seventh conductive lines extending in the first direction on the front side of the semiconductor wafer in the first layer, wherein the first through fifth conductive lines are positioned between the sixth and seventh conductive lines, the first, second, and sixth conductive lines are a total of three conductive lines in the first layer overlying the first and second active regions, and the fourth, fifth, and seventh conductive lines are a total of three conductive lines in the first layer overlying the third and fourth active regions.

9. The semiconductor device of claim 6, wherein the first transistor comprises one of an n-type or p-type transistor, and the second transistor comprises the other of the n-type or p-type transistor.

10. The semiconductor device of claim 6, further comprising:

a sixth conductive line extending in the first direction on the front side of the semiconductor wafer in the first layer;

a third power rail extending in the first direction on the back side of the semiconductor wafer;

a third transistor comprising:

the first gate structure;

fifth and sixth active regions adjacent to the first gate structure; and a third channel region extending between the fifth and sixth active regions through the first gate structure;

a sixth via positioned between and electrically connecting the fifth active region and the sixth conductive line; and a seventh via positioned between and electrically connecting the sixth active region and the third power rail.

11. A semiconductor device comprising:

a first conductive line positioned on a front side of a semiconductor wafer;

a first power rail positioned on a back side of the semiconductor wafer;

a first transistor positioned on the front side of the semiconductor wafer, the first transistor comprising:

a first gate structure;

first and second active regions adjacent to the first gate structure; and a first channel region extending between the first and second active regions through the first gate structure;

a first via positioned between and electrically connecting the first active region and the first conductive line; and a second via positioned between and electrically connecting the first active region and the first power rail, the second via overlapping the first via and overlapping the first active region.

12. The semiconductor device of claim 11, further comprising:
a plurality of second transistors positioned on the front side of the semiconductor wafer and aligned with and adjacent to the first transistor,
wherein the plurality of second transistors comprises a corresponding plurality of gate structures comprising the first gate structure.

13. The semiconductor device of claim 12, further comprising:
a second conductive line positioned on the front side of the semiconductor wafer and configured to a have a ground voltage level; and
a plurality of third vias positioned between and electrically connecting corresponding gate structures of the plurality of gate structures and the second conductive line.

14. The semiconductor device of claim 12, wherein the gate structures of the plurality of gate structures are configured to float.

15. The semiconductor device of claim 12, further comprising:
a second power rail positioned on the back side of the semiconductor wafer;
a third transistor positioned on the front side of the semiconductor wafer and aligned with and adjacent to the plurality of second transistors, the third transistor comprising:
a second gate structure, wherein the plurality of gate structures comprises the second gate structure;
third and fourth active regions adjacent to the second gate structure; and
a second channel region extending between the third and fourth active regions through the second gate structure;
a fourth via positioned between and electrically connecting the third active region and the first conductive line; and
a fifth via positioned between and electrically connecting the third active region and the second power rail.

16. The semiconductor device of claim 12, further comprising:
a second conductive line positioned on the front side of the semiconductor wafer;
a third transistor positioned on the front side of the semiconductor wafer and aligned with and adjacent to the plurality of second transistors, the third transistor comprising:
a second gate structure, wherein the plurality of gate structures comprises the second gate structure;
third and fourth active regions adjacent to the second gate structure; and
a second channel region extending between the third and fourth active regions through the second gate structure;
a fourth via positioned between and electrically connecting the third active region and the second conductive line; and
a fifth via positioned between and electrically connecting the third active region and the first power rail.

17. The semiconductor device of claim 11, further comprising:

a third via positioned between and electrically connecting the second active region and the first conductive line; and
a fourth via positioned between and electrically connecting the second active region and the first power rail.

18. A method of manufacturing a semiconductor device, the method comprising:
fabricating a first transistor by:
forming first and second active regions in a semiconductor wafer;
forming a gate structure extending in a first direction;
forming a first channel region extending between the first and second active regions through the gate structure; and
forming a first conductive segment on the first active region;
forming a first via on the first conductive segment;
forming a first conductive line on the first via and extending in a second direction perpendicular to the first direction on a front side of the semiconductor wafer;
forming a second via on the second active region and extending at least partially through the semiconductor wafer at a back side of the semiconductor wafer; and
forming a first power rail on the second via and extending in the second direction on the back side of the semiconductor wafer.

19. The method of claim 18, wherein
the fabricating the first transistor further comprises forming a second conductive segment on the second active region,
the forming the first via on the first conductive segment comprises forming a third via on the second conductive segment,
the forming the first conductive line on the first via comprises forming the first conductive line on the third via,
the forming the second via on the second active region comprises forming a fourth via on the first active region and extending to the back side of the semiconductor wafer, and
the forming the first power rail on the second via comprises forming the first power rail on the fourth via.

20. The method of claim 18, wherein
the fabricating the first transistor further comprises fabricating a second transistor by:
forming third and fourth active regions in the semiconductor wafer;
forming a second gate structure extending in the first direction;
forming a second channel region extending between the third and fourth active regions through the gate structure; and
forming a second conductive segment on the third active region
the forming the first via comprises forming a third via on the second conductive segment;
the forming the first conductive line comprises forming a second conductive line on the third via and extending in the second direction on the front side of the semiconductor wafer;
the forming the second via comprises forming a fourth via on the fourth active region and extending to the back side of the semiconductor wafer; and
the forming the first power rail comprises forming a second power rail on the fourth via and extending in the second direction on the back side of the semiconductor wafer.

* * * * *